United States Patent
Yamano

(10) Patent No.: US 7,365,436 B2
(45) Date of Patent: Apr. 29, 2008

(54) SUBSTRATE HAVING A PENETRATING VIA AND WIRING CONNECTED TO THE PENETRATING VIA AND A METHOD FOR MANUFACTURING THE SAME

(75) Inventor: Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/247,713

(22) Filed: Oct. 11, 2005

(65) Prior Publication Data
US 2006/0097378 A1 May 11, 2006

(30) Foreign Application Priority Data
Nov. 8, 2004 (JP) ............... 2004-323940

(51) Int. Cl.
*H01L 23/55* (2006.01)

(52) U.S. Cl. ............... 257/774; 257/773; 257/778; 257/786; 257/734; 257/E23.067; 438/629

(58) Field of Classification Search ............... 257/774
See application file for complete search history.

(56) References Cited

U.S. PATENT DOCUMENTS

| | | | | |
|---|---|---|---|---|
| 4,170,819 A * | 10/1979 | Peter et al. | ............... | 29/853 |
| 5,863,816 A * | 1/1999 | Cho | ............... | 438/123 |
| 6,252,779 B1 * | 6/2001 | Pierson et al. | ............... | 361/774 |
| 6,259,039 B1 * | 7/2001 | Chroneos et al. | ............... | 174/263 |
| 6,365,974 B1 | 4/2002 | Abbott et al. | | |
| 6,664,485 B2 * | 12/2003 | Bhatt et al. | ............... | 174/264 |
| 6,700,079 B2 * | 3/2004 | Bogursky et al. | ............... | 174/268 |
| 6,784,377 B2 * | 8/2004 | Chamberlin et al. | ............... | 174/265 |
| 6,849,805 B2 * | 2/2005 | Honda et al. | ............... | 174/250 |
| 6,984,576 B1 * | 1/2006 | Lin et al. | ............... | 438/611 |
| 2003/0107119 A1 | 6/2003 | Kim | | |
| 2004/0188824 A1 * | 9/2004 | Akram et al. | ............... | 257/698 |
| 2005/0040513 A1 * | 2/2005 | Salmon | ............... | 257/698 |

FOREIGN PATENT DOCUMENTS

| | | |
|---|---|---|
| EP | 1447850 | 8/2004 |
| JP | 258457 | 10/1989 |

* cited by examiner

*Primary Examiner*—Sue A. Purvis
*Assistant Examiner*—Eduardo A. Rodela
(74) *Attorney, Agent, or Firm*—Ladas & Parry LLP

(57) ABSTRACT

A disclosed substrate includes a base member having a through-hole, and a conductive metal filling in the through-hole so as to form a penetrating via. The penetrating via contains a conductive core member that is substantially at the central axis of the through-hole.

6 Claims, 20 Drawing Sheets

SUBSTRATE HAVING A PENETRATING VIA AND WIRING CONNECTED TO THE PENETRATING VIA AND A METHOD FOR MANUFACTURING THE SAME

BACKGROUND OF THE INVENTION

1. Field of the Invention

The present invention generally relates to a substrate and a method for manufacturing the same, and particularly relates to a substrate having a penetrating via penetrating the base member and wiring connected to the penetrating via, and a method for manufacturing the same.

2. Description of the Related Art

In these years, by using fine processing technology of manufacturing a semiconductor, packages called MEMS (Micro Electro Mechanical Systems) for a micro machine and a substrate such as an interposer mounting a semiconductor device therein, are developed. The above described substrate adopts a configuration wherein a penetrating via is formed in a through-hole penetrating a base member so as to electrically connect wirings formed on corresponding sides of the base member.

FIG. 1 is a cross-sectional view showing a substrate. As shown in FIG. 1, the substrate 10 comprises a silicon member 11, an insulating layer 13, penetrating vias 15, wirings 17 and 21, and solder resists 19 and 24. In the silicon member 11, through-holes 12 penetrating the silicon member 11 are formed. The insulating layer 13 is formed so as to cover the surface of the silicon member 11 where the through-holes 12 are formed. The insulating layer 13 is provided for insulating the penetrating via 15 and the wirings 17 and 21 from the silicon member.

The penetrating via 15 is provided in the through-hole 12 where the insulating layer 13 is formed. The penetrating via 15 has a cylindrical shape and an end part 15a of the penetrating via 15 and a surface 13a of the insulating layer 13 are to be coplanar and another end part 15b of the penetrating via 15 and another surface 13b of the insulating layer 13 are also to be coplanar. The penetrating via 15 is connected to the wirings 17 and 21 provided on corresponding sides of the silicon member 11. The penetrating via 15 is provided for electrically connecting the wirings 17 and 21 formed on corresponding sides of the silicon member 11.

The penetrating via 15 is provided by the following steps of: forming a seed layer by a spattering method on an upper surface of the silicon member 11 where the insulating layer 13 is formed and depositing a conductive metal layer on the seed layer by the elecrolytic plating method (See Patent Document 1, for example).

The wiring 17 which is connected to the edge part 15a of the penetrating via 15 comprises an external connection terminal 18. The external connection terminal 18 is connected to another substrate such as a motherboard 26. A solder resist layer 19 exposing the external connection terminal 18 is formed on the upper surface of the base member 11 so as to cover the wiring 17 except the external connection terminal 18.

The wiring 21 connected to the edge part 15b of the penetrating via 15 includes an external connection terminal 22. MEMS or a semiconductor device 25 are mounted on the external connection terminal 22. The solder resist 24 exposing the external connection terminal 22 is provided on an undersurface of the silicon member 11 so as to cover the wiring 21 except the external connection terminal 22.

However, the shape of the conventional penetrating via 15 is cylindrical, so that water infiltrates into a gap between the insulating layer 13 facing the penetrating via 15 and the penetrating via 15, and thereby, the penetrating via 15 is degraded and electrical connection reliability between the wirings 17, 21 and the penetrating via 15 is reduced.

Moreover, according to a conventional method for forming the penetrating via 15, a separat conductive metal layer on a surface of a seed layer is formed on inside edges of the through-hole 12 and the conductive metal layer is grown along the inside edges of the through-hole 12, and thus, a void (cavity) remains near the center of the penetrating via 15. Therefore, the electrical connection reliability of the penetrating via 15 connected to the wirings 17 and 21 is degraded.

SUMMARY OF THE INVENTION

The present invention provides a substrate having a penetrating via and wiring connected to the penetrating via, that substantially obviates one or more of the above problems.

Features and advantages of an embodiment of the present invention are presented in the description which follows, and in part will become apparent from the description and the accompanying drawings, or may be learned by practice of the invention according to the teachings provided in the description. Objects as well as other features and advantages of the present invention will be realized and attained by a substrate having a penetrating via and wiring connected to the penetrating via particularly pointed out in the specification in such full, clear, concise, and exact terms as to enable a person having ordinary skill in the art to practice the invention.

To achieve these and other advantages in accordance with the purpose of the invention, an embodiment of the invention provides a substrate comprising a base member having a through-hole and a conductive metal filling the through-hole so as to form a penetrating via, wherein the penetrating via contains a conductive core member therein, and the conductive core member is disposed substantially at a central axis of the through-hole.

According to an embodiment of the invention, the conductive core member is disposed substantially at a central axis of the through-hole where the conductive core member is used as an electrode, and thereby, the conductive metal is grown from the conductive core member to the surface of the base member forming the through-hole; and thus a void (cavity) is prevented from remaining in the penetrating via.

According to an aspect of the present invention, a substrate is provided which is composed of a base member having a through-hole; and conductive metal filling the through-hole so as to form a penetrating via, wherein the penetrating via includes a penetrating part provided in the through-hole; and protrusions protruding from the base member, which protrusions are connected to corresponding ends of the penetrating part, wherein the penetrating part contains a conductive core member therein, and the conductive core member is disposed substantially at a central axis of the through-hole.

According to at least one embodiment of the invention, the conductive core member which is disposed substantially at a central axis of the through-hole is used as an electrode, and thereby, the conductive metal is grown from the conductive core member to the surface of the base member forming the through-hole. Thus, a void (cavity) is prevented from remaining in the penetrating via. Moreover, protrusions, which are wider than the diameter of the penetrating part, are disposed on each end of the penetrating part, and thereby, water is prevented from infiltrating the gap between the base member facing the penetrating part and the base member. Thus, the penetrating via is protected from being degraded.

According to another aspect of the present invention, a method for manufacturing a substrate comprises a base member having a through-hole, a conductive metal filling in the through-hole, and a penetrating via containing a conductive core member therein, the conductive core member being disposed substantially at a central axis of the through-hole, the method including the steps of disposing the conductive core member substantially at a central axis of the through-hole, and filling the through-hole with the conductive metal according to an electrolytic plating method by using the conductive member as an electrode.

According to at least one embodiment of the invention, the conductive core member is used as an electrode, the conductive metal is separated and grown from the conductive core member to the surface of the base member forming the through-hole by the electrolytic plating method so as to prevent a void (cavity) from remaining in the penetrating via.

BRIEF DESCRIPTION OF THE DRAWINGS

Other objects and further features of the present invention will be apparent from the following detailed description when read in conjunction with the accompanying drawings, in which.

DESCRIPTION OF THE PREFERED EMBODIMENTS

In the following, embodiments of the present invention are described with reference to the accompanying drawings.

First Embodiment

Figure 1:
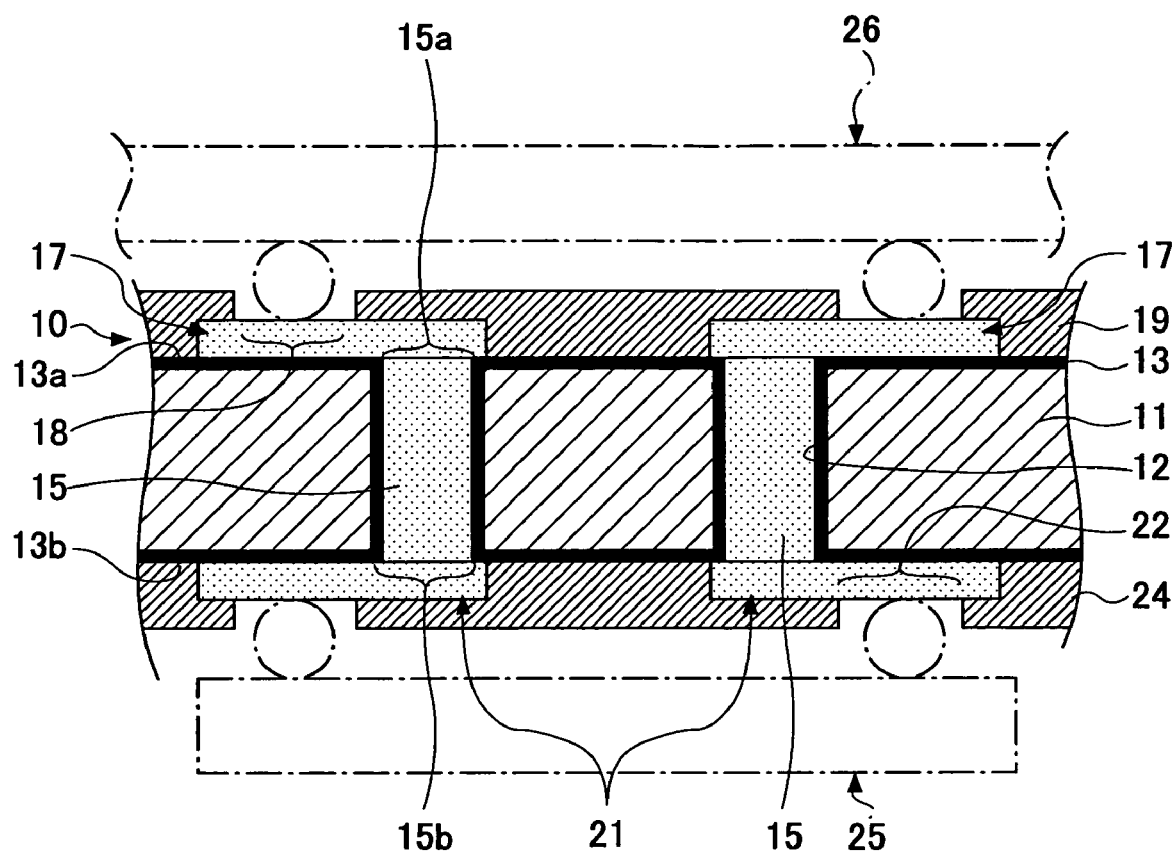
FIG. 1 is a cross-sectional view of a conventional substrate.
Figure 2:
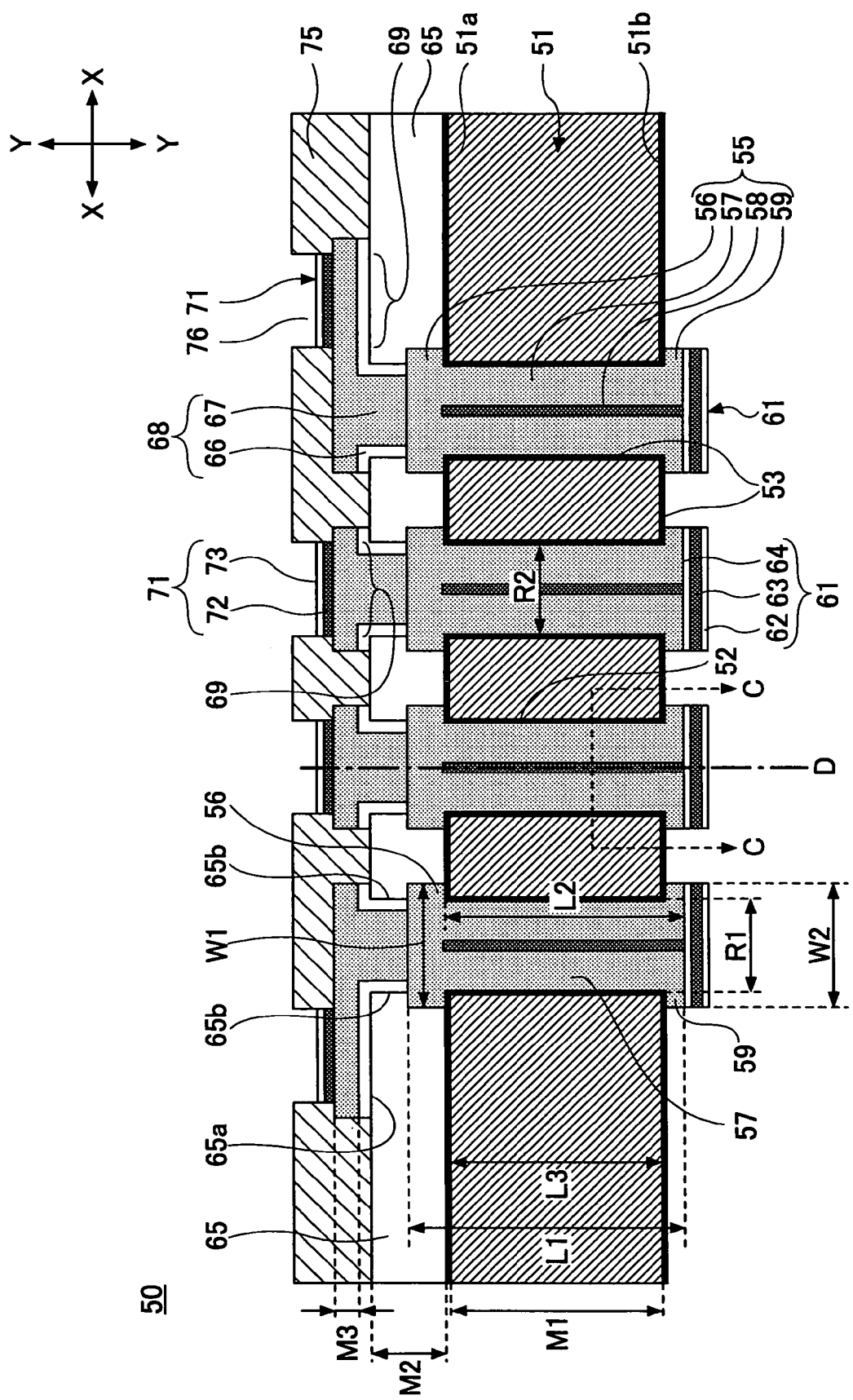
FIG. 2 is a cross-sectional view showing a substrate according to a first embodiment of the present invention.
Figure 3:
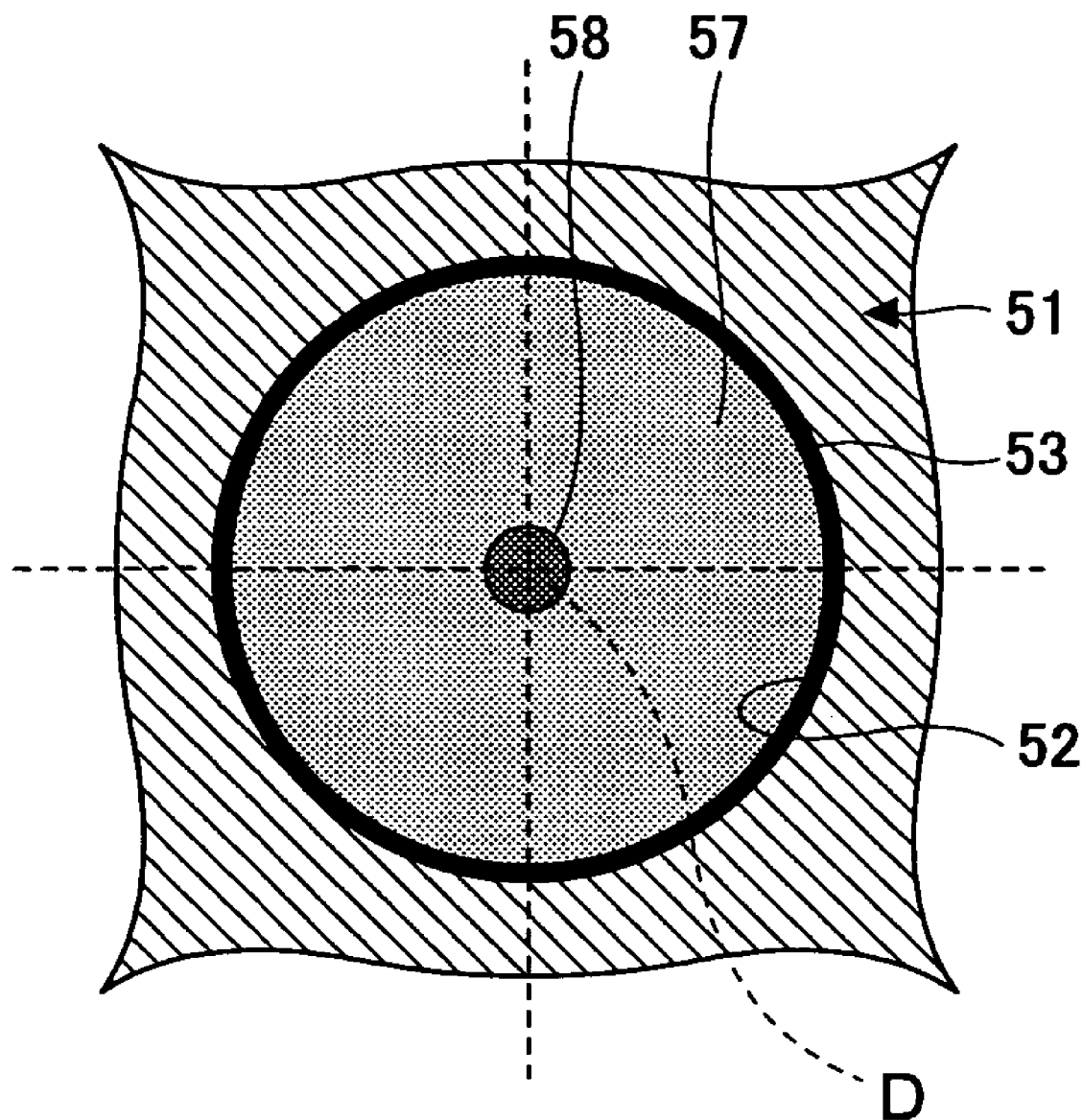
FIG. 3 is a cross-sectional view of the substrate shown in FIG. 2 along the line C-C.

First, with reference to FIGS. 2 and 3, a description is given of a configuration of a substrate 50 according to a first embodiment of the present invention. FIG. 2 is a cross-sectional view of the substrate according to the first embodiment of the present invention, and FIG. 3 is a cross-sectional view of the substrate shown in FIG. 2 along the line C-C. It should be noted that as shown in FIG. 2, the Y←—→Y direction is a lengthwise direction of a conductive core member 58 and the X←—→X direction in a direction perpendicular to the Y←—→Y is a transverse direction of a base member 51.

The substrate 50 is composed of a base member 51, insulating layers 53 and 65, a penetrating via 55, wiring 68, diffusion protecting layers 61 and 71, and a solder resist layer 75. The substrate 50 is an interposer. As shown in FIG. 2, for example, MEMS (Micro Electro Mechanical Systems) where a fine processing technology of manufacturing a semiconductor is used and a semiconductor device are mounted on the undersurface of the substrate 50, and another substrate such as a motherboard is mounted on the upper surface of the substrate 50 (the side on which the wiring 68 is formed).

The base member 51 comprises a silicon member which is composed of silicon. The thickness M1 of the base member 51 is, for example, 100 through 200 μm. In the base member 51, plural through-holes 52 are formed. The diameter R2 of the through-hole 52 is, for example, more than 80 μm. It should be noted that as the base member 51, members other than the silicon member such as a glass member can be used. When an insulating member such as a glass member is used, it is not necessary to form the insulating layer 53.

The insulating layer 53 is formed so as to cover the surface of the base member 51 including through-holes 52. The insulating layer 53 is provided for insulating the base member which is composed of silicon from the penetrating via 55.

The penetrating via 55 is composed of a penetrating part 57, a first protrusion i.e. a connection pad 59, a second protrusion, i.e., a wiring connecting part 56, and a conductive core member 58. The penetrating via 55 is formed by separating a conductive metal and growing the penetrating via using the conductive core member 58 as an electrode. As the conductive metal, for example, a Ni—Co alloy can be used. The composition of the Ni—Co alloy is, for example, Ni:Co=6:4 through 7:3.

The penetrating part 57 having a cylindrical shape is formed in the through-hole 52 where the insulating layer 53 is formed. The diameter of the penetrating part 57 is R1 (hereinafter, the diameter of the penetrating part 57 is referred to as "Diameter R1"). The Diameter R1 of the penetrating part 57 is substantially equal to the diameter R2 of the through-hole 52.

The wiring connecting part 56 is provided on the upper end of the penetrating part 57. The wiring connecting part 56 protruding from the upper surface 51a of the base member 51 is wider than the diameter R1 of the penetrating part 57. In other words, the width W1 of the wiring connecting part 56 is larger than the diameter R1 of the penetrating part 57 (W1>R1). The wiring connecting part 56 is unified with the penetrating part 57. Moreover, the wiring connecting part 56 is connected to the wiring 68 having an external connection terminal 69.

The connection pad 59 is formed on the lower end of the penetrating part 57. The connection pad 59 protruding from the undersurface 51b of the base member 51 is wider than the diameter R1 of the penetrating part 57. In other words, the width W2 of the connection pad 59 is larger than the diameter R1 of the penetrating part 57 (W2>R1). The connection pad 59 is provided for mounting the MEMS and the semiconductor device. The penetrating part 57, the wiring connecting part 56 and connection pad 59 are unified by the conductive metal.

Accordingly, the wiring connecting part 56 which is wider than the diameter R1 of the penetrating part 57 and protrudes from the surface 51a of the base member 51, is disposed on one end of the penetrating part 57, and the connection pad 59 which is wider than the diameter R1 of the penetrating part 57 and protrudes from the surface 51b of the base member 51, is disposed on the other end of the penetrating part 57, and thus, the insulating layer 53 is formed and water is prevented from infiltrating the gap between the base member 51 facing the penetrating part 57 and the penetrating part 57, and accordingly, the penetrating via 55 (especially penetrating part 57) is protected from being degraded.

The conductive core member 58 is a conductive linear material. The conductive core member 58 is supported to be substantially coincident with the central axis D of the through-hole 52 by the diffusion protecting layer 61 which is a conductive member. As the conductive core member 58, for example, gold wire formed by a wire bonding method can be used. When gold wire is used as the conductive core member 58, the diameter of the gold wire is, for example, 20 through 30 µm (25 µm is preferable). The wire bonding method can be applied to the case where, for example, the diameter R2 of the through-hole 52 is more than 80 µm, and the depth of the through-hole 52 is 100 through 200 µm. It should be noted that the shape of the through-hole 52 to which the wire bonding method can be applied depends on the shape of the capillary tip of the wire bonding machine.

The length L2 of the conductive core member 58 should be shorter than the length L1 of the penetrating via 55 (L2<L1). Accordingly, by setting the length L2 of the conductive core member 58 shorter than the length L1 of the penetrating via 55, the wiring 68 can be connected to the wiring connecting part 56 without being disturbed by the conductive core member 58 when the wiring 68 is disposed on the wiring connecting part 56. It should be noticed that the length L1 of the penetrating via 55 is the length from the end of the wiring connecting part 56 connected to the wiring 68 to the end of the connection pad 59 connected to the diffusion protecting layer 61.

Moreover, the length L2 of the conductive core member 58 can be longer than the length L3 of the penetrating part 57, and the length L2 of the conductive core member 58 can be shorter than the length L1 of the penetrating via 55 (L3<L2<L1) and the conductive core member 58 can be disposed so as to penetrate the penetrating part 57. Accordingly, when the penetrating via 55 is formed, the conductive core member 58 penetrating the penetrating part 57 is formed so as to be used as an electrode, and a conductive metal is grown from the conductive core member 58 to the surface of the base member 51 having the through-hole 52, and thus a void is prevented from remaining in the penetrating via 55 (especially, the penetrating part 57).

The diffusion protecting layer 61 is a conductive member formed on an end of the connection pad 59. The diffusion protecting layer 61 is provided for improving the wettability of the solder and for preventing Cu contained in the penetrating via 55 from diffusing into the solder (drawing is omitted) connected to the connection pad 59. The conductive core member 58 is connected to the diffusion protecting layer 61. Accordingly, the conductive core member 58 is connected to the diffusion protecting layer 61 so as to support the conductive core member 58 being kept substantially coincident with the central axis D of the through-hole 52. Moreover, the diffusion protecting layer 61 is used as a conductive member so that the penetrating via 55 can be connected to a semiconductor and another substrate via the diffusion protecting layer 61. As the diffusion protecting layer 61, for example, an Au/Ni/Au layer which is composed of an Au layer 62, a Ni layer 63, and an Au layer 64 can be used. The Au layer 64 is a layer for connecting the conductive core member 58. When a gold wire is used as the conductive core member 58, the Au layer 64 is formed on the part to be connected to the conductive core member 58 so as to obtain enough bonding strength between the diffusion protecting layer 61 and the gold wire. It should be noted that the thickness of the Au layers 62 and 64 is, for example, 0.2 through 0.5 µm, and the thickness of the Ni layer 63 is, for example, 2 through 5 µm. Moreover, other than the Au/Ni/Au layer, for example, a Pd/Ni/Pd layer and an Au/Pd/Ni/Pd/Au layer can be used as the diffusion protecting layer 61.

The insulating layer 65 is formed on the upper surface 51a of the base member 51 so as to expose the wiring connecting part 56. As the insulating layer 65, for example, a resin containing metal particles diffused and a resin containing metal compound particles diffused can be used. In this case, as the resin, for example, an epoxy resin and a polyimide resin can be used. As the metal for a catalyst of plating, for example, palladium and platinum can be used. Especially, palladium is preferable. Moreover, as the metal compound, for example, palladium chloride and palladium sulfate can be used. It should be noted that, in the present embodiment, an epoxy resin containing the palladium particles diffused is used as the insulating layer 65. By using epoxy resin containing palladium particles diffused as the insulating layer 65, when forming an electroless plated layer (a seed layer 66 which will be described below), without performing a desmear treatment and a palladium activation treatment in advance, an electroless plated layer (a seed layer 66 which is described below) can be formed directly on the insulating layer 65 according to an electroless plating method (see FIG. 19). Accordingly, the manufacturing steps of the substrate 50 can be simplified. The thickness M2 of the insulating layer 65 is, for example, 5 µm.

The wiring 68 is formed on the insulating layer 65 so as to be connected to the wiring connecting part 56. The wiring 68 having an external connection terminal 69 is composed of a conductive metal part 67 and a seed layer 66. The external connection terminal 69 is provided for being connected to a substrate such as a motherboard. Accordingly, by providing the external connection terminal 69 on the wiring 68, the external connection terminal 69 can be disposed corresponding to the external connection terminal disposed on the substrate such as a motherboard. As the conductive metal part 67, for example, Cu can be used. When Cu is used as the conductive metal part 67, the thickness M3 of the conductive metal part 67 is, for example, 3 through 10 µm. As the seed layer 66, for example, a Ni layer can be used. The thickness of the seed layer 66 is, for example, about 0.1 µm.

The solder resist layer 75 exposing the external connection terminal 69 is formed so as to cover the wiring 68 and the insulating layer 65 except the external connection terminal 69. The solder resist layer 75 has an open part 76 exposing the external connection terminal 69. The solder resist layer 75 is provided for protecting the wiring 68.

The diffusion protecting layer 71 is formed on the external connection terminal 69. The diffusion protecting layer 71 is provided for improving wettability of the solder and protecting Cu contained in the wiring 68 form diffusing into the solder (drawing is omitted) connected to the external connection terminal 69. The diffusion protecting layer 71 can be composed of, for example, a lamination layer including a Ni layer 72 and an Au layer 73. The thickness of the Ni layer 72 is, for example, 2 through 5 µm, and the thickness of the Au layer 73 is, for example, 0.2 through 0.5 µm.

It should be noted that as the diffusion protecting layer 71, a Ni/Pd layer and a Ni/Pd/Au layer (the Ni layer is the side to be connected to the external connection terminal) can be used.

Figure 4:
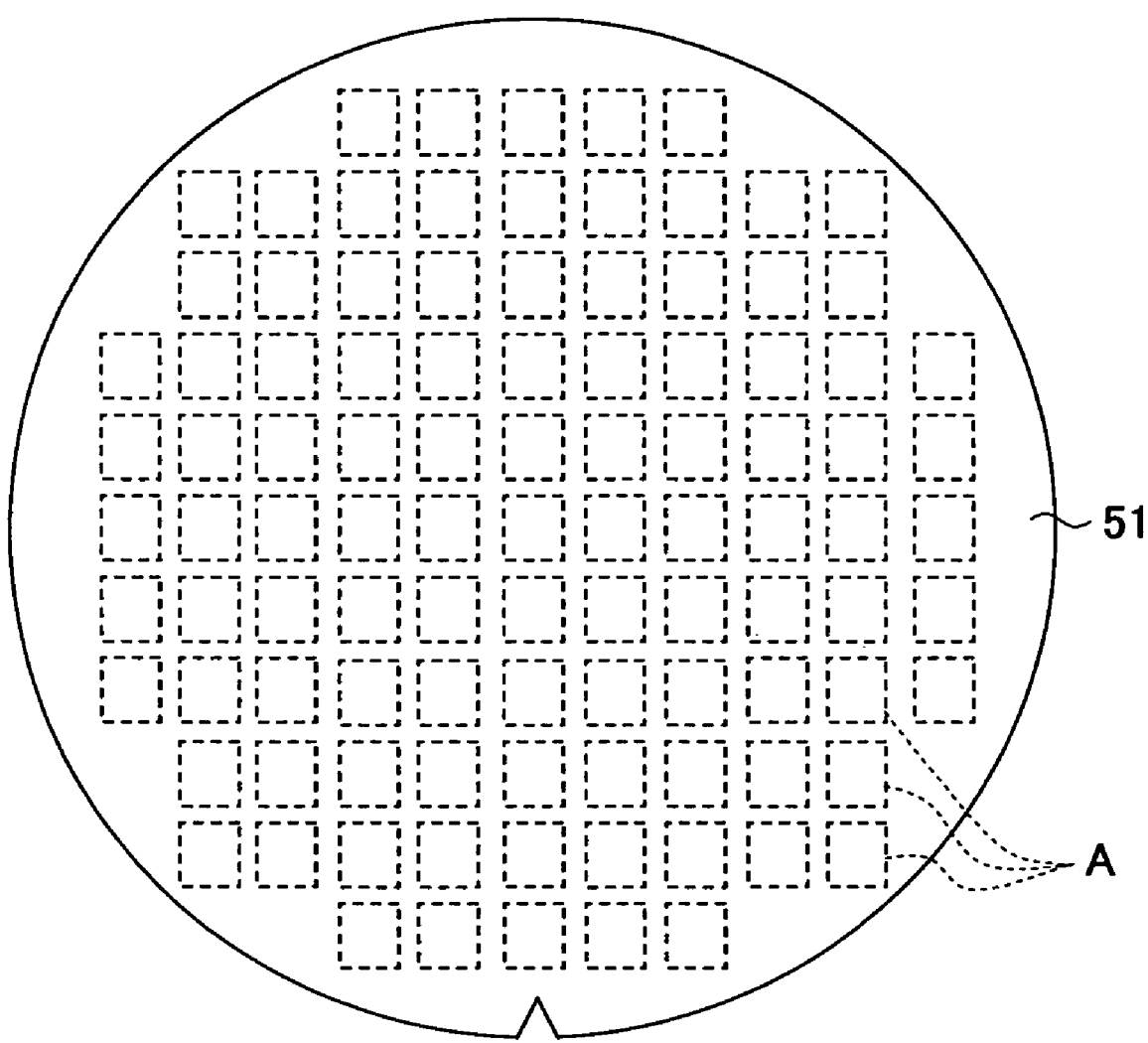
FIG. 4 is a plan view of a base member used for manufacturing the substrate according to the present embodiment.

FIG. 4 is a plan view of the base member 51 used for manufacturing the substrate according to the present embodiment. It should be noted that "A" as shown in FIG. 4 shows an area where the substrate 50 is formed (hereinafter, "A" is referred to as "Substrate Forming Area A"). As shown in FIG. 4, in the present embodiment, a cylindrical silicon member having a plurality of the Substrate Forming Areas A is used as the base member 51 when the substrate 50 is formed. Accordingly, a silicon member having the Substrate Forming Areas A is used, the substrate 50 according to a manufacturing method which is described below is manufactured, and the base member 51 is diced so as to provide plural substrates 50 all at once; therefore, the productivity of manufacturing the substrate 50 can be improved.

Next, with reference to FIGS. 5 through 32, a description is given of a method for manufacturing the substrate 50 according to the first embodiment. It should be noted that the silicon member shown in FIG. 4 is used as the base member 51.

Figure 5:
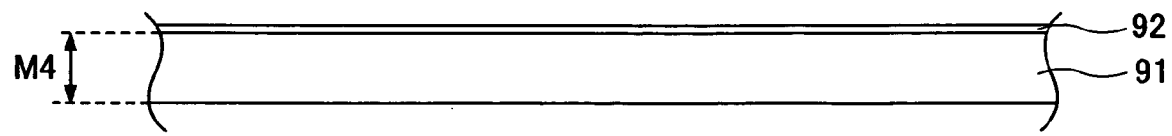
FIGS. 5 through 32 are diagrams showing steps of manufacturing the substrate according to the first embodiment.

First, as shown in FIG. 5, an adhesive tape 92 is attached on a support board 91. The support board 91 is provided for supporting the base member 51 so as to protect the base member 51 from being warped. As the support board 91, for example, a glass member and a silicon member (more specifically a silicon wafer) can be used. When the silicon member is used as the support board 91, the thickness M4 of the support board is, for example, 725 μm. The adhesive tape 92 is provided for bonding a metal foil 93 which is described below to the support board 91. As the adhesive tape 92, for example, a thermo peal tape which loses adhesion when being heated can be used. In stead of the adhesive tape 92, a thermal ablation agent can be used.

Figure 6:
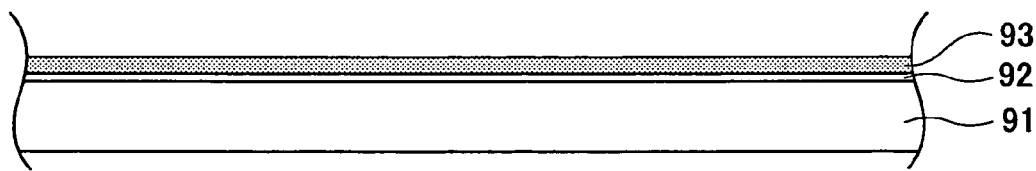
Figure 7:
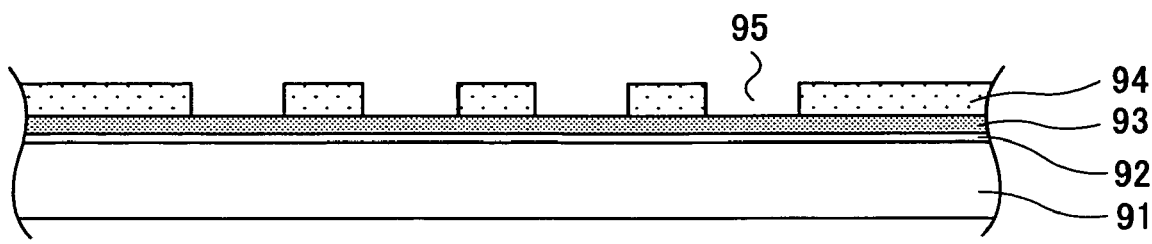

Next, as shown in FIG. 6, the metal foil 93 such as Cu is bonded on the support board 91 via the adhesive tape 92. Then, as shown in FIG. 7, a dry film resist layer 94 having an open part 95 is formed on the metal foil 93. The area on the metal foil 93 where the diffusion protecting layer 61 is formed is exposed from the open part 95 of the dry film resist layer 94.

Figure 8:
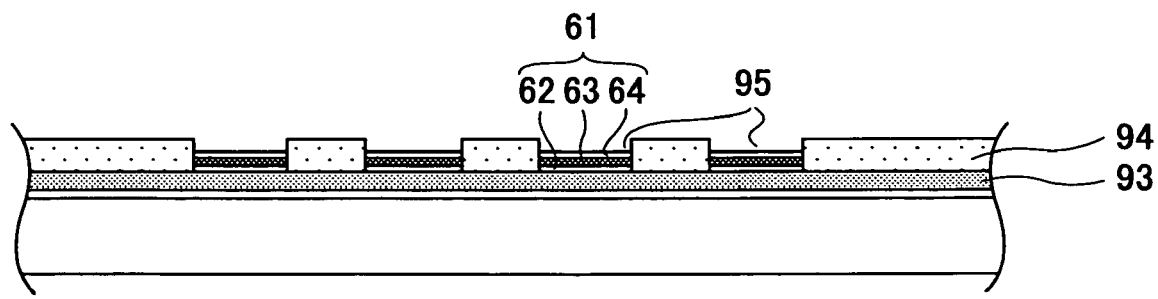
Figure 9:
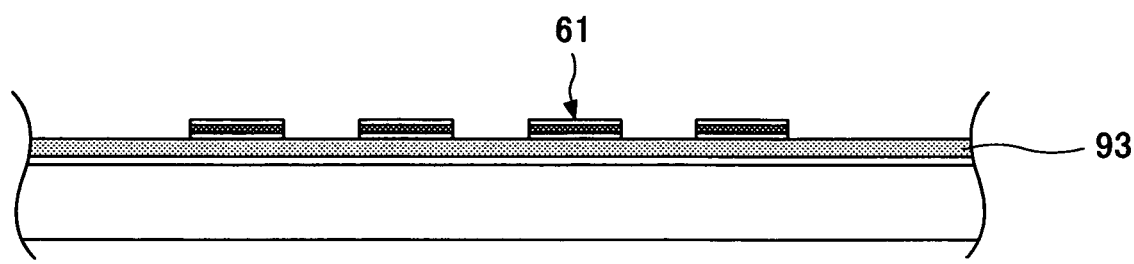

Next, as shown in FIG. 8, by using the metal foil 93 as an electrode, an Au layer 62, a Ni layer 63 and an Au layer 64 are formed in turn on the metal foil 93 exposed from the open part 95 so as to form the diffusion protecting layer 61 according to the electrolytic plating method. The thickness of the Au layers 62 and 64 are, for example, 0.2 through 0.5 μm, and the thickness of the Ni layer 63 is, for example, 2 through 5 μm. Accordingly, by the electrolytic plating method, a diffusion protecting layer superior to a layer formed by an electroless plating method can be formed. Then, as shown in FIG. 9, the dry film resist layer 94 is removed by the resist stripper.

Figure 10:
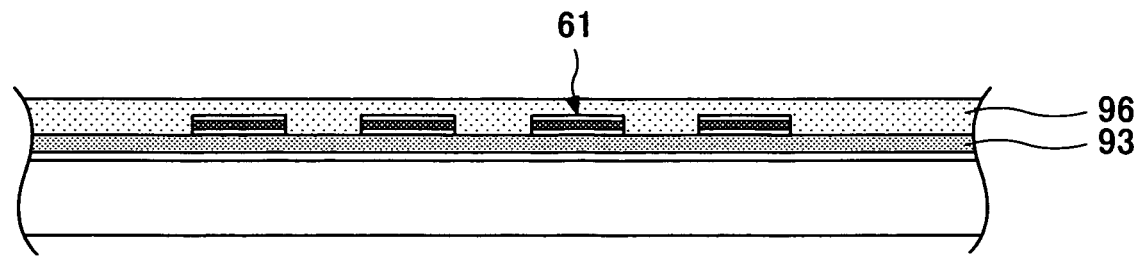

Next, as shown in FIG. 10, a resist layer 96 which is not in the exposure state is formed so as to cover the diffusion protecting layer 61 and the metal foil 93. The resist layer 96 contains a resist material having adhesion, and for example, a photosensitive dry film resist and a liquid resist can be used as the resist layer 96.

Figure 11:
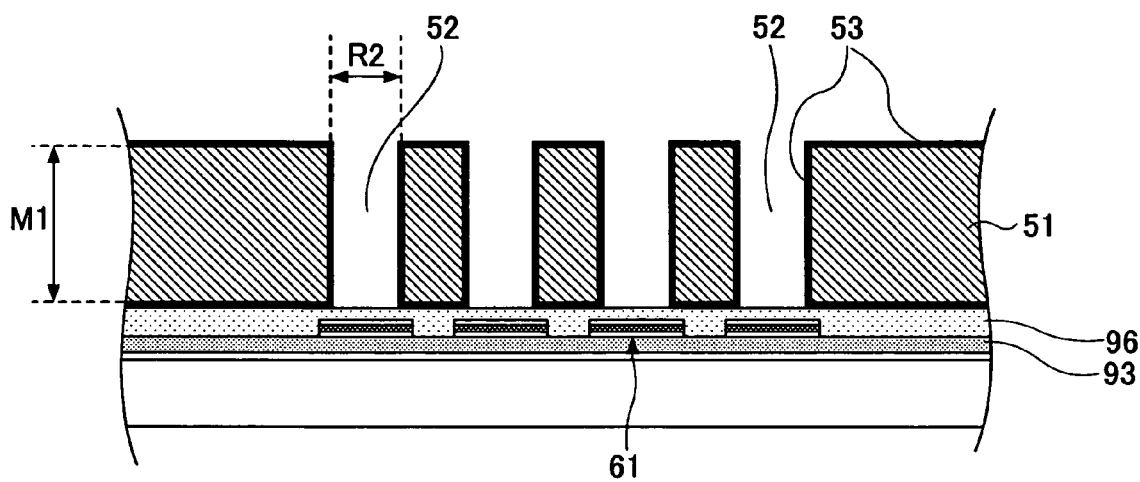

By using the resist layer 96 having adhesion, the base member 51 where the through-hole 52 is formed can be fixed on the support board 91 via the resist layer 96 (as shown in FIG. 11). It should be noted that the thickness of the resist layer 96 is, for example, 10 through 15 μm. Moreover, instead of the resist layer 96, an epoxy adhesive and a polyimide adhesive can be used if the adhesives can be dissolved by some treatment liquid.

Next, as shown in FIG. 11, the through-hole 52 having a diameter R2 of an aperture is formed in the base member 51 and the insulating layer 53 is formed so as to cover the surface (including a part of the base member 51 corresponding to the through-hole 52) of the base member 51, the base member 51 being disposed on the resist layer 96 having adhesion and fixed on the support board 91 via the resist layer 96. The through-hole 52 can be formed, for example, by one of drill processing, laser processing, and anisotropic etching. The diameter R2 of the aperture of the through-hole 52 is, for example, more than 80 μm.

As the insulating layer 53, for example, an oxidized layer ($SiO_2$) formed by a CVD method and a thermal oxidized layer ($SiO_2$) formed by an oxidizing furnace can be used. The thickness M1 of the base member 51 is, for example, 150 μm.

Figure 12:
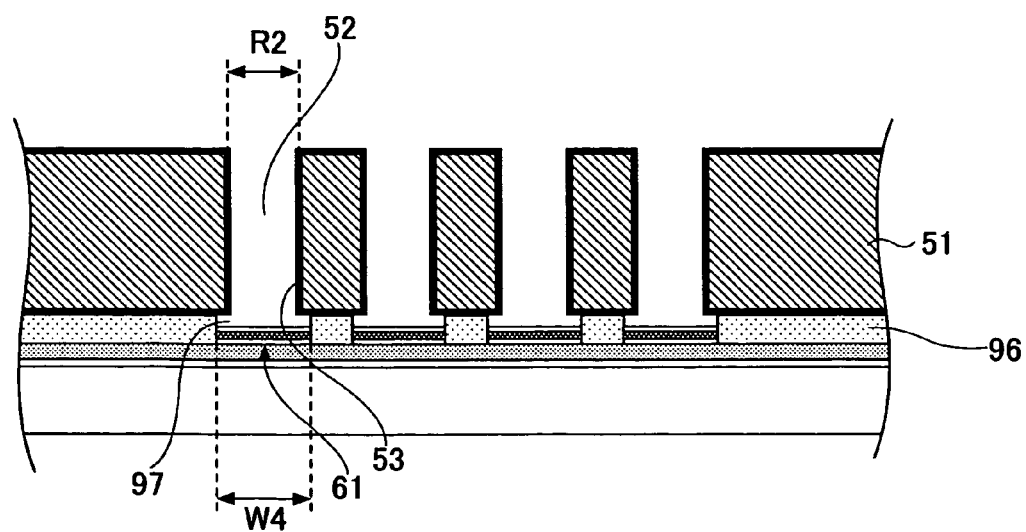

Next, as shown in FIG. 12, by supplying a developer to the inside of the through-hole 52, the resist layer 96 exposed on the through-hole 52 is dissolved so as to form a space 97. The space 97 is wider than the diameter of the aperture of the through-hole 52; thus the width W4 of the space 97 is greater than the diameter R2 of the aperture of the through-hole 52 (W4>R2). The width W4 of the space 97 is substantially equal to the width W2 of the connection pad 59. Moreover, the diffusion protecting layer 61 is exposed from the space 97.

As a method for supplying a developer into the through-hole 52, for example, a dip development wherein the structure as shown in FIG. 12 is dipped in the developer and a spray development wherein the developer is sprayed onto the through-hole 52 like a shower can be used. In either method of development, the wetting time of the developer is controlled so as to form the space 97. As a condition for forming the space 97 by the spray development, for example, the spraying pressure is 2.0 kgf/cm², the temperature is in the range 25 through 30° C., and the spraying time is 6 min. (when the thickness of the resist layer 96 is in the range 10 through 15 μm).

Then, a thermal treatment is performed on the structure shown in FIG. 12, and a polymerization reaction is carried out on the resist layer 96 which is not in the exposure state so as to harden the resist layer 96 (the first resist layer hardening step). Accordingly, the resist layer 96 is hardened so as to have tolerance for the plating solution.

Figure 13:
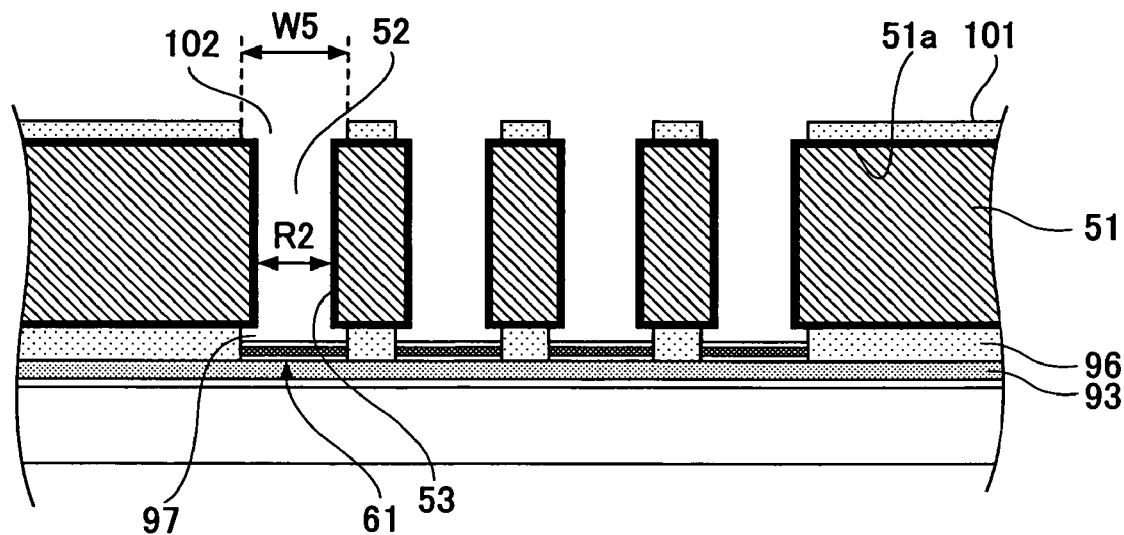
Figure 14:
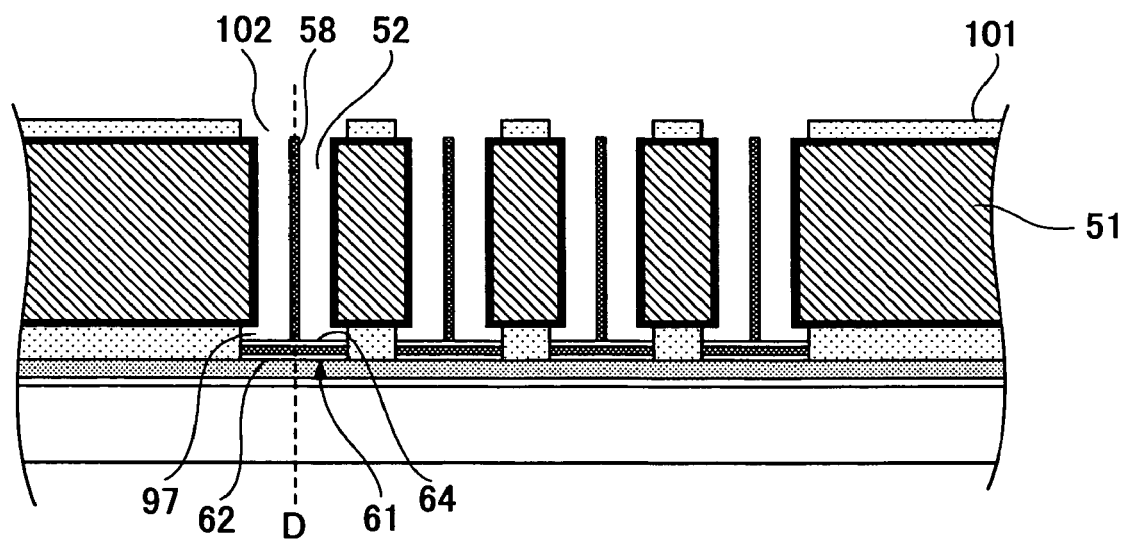

Next, as shown in FIG. 13, a dry film resist layer 101 having an open part 102 exposing the through-hole 52 is formed on the insulating layer 53 provided on the upper surface 51a of the base member 51. The diameter W5 of the aperture of the open part 102 is wider than the diameter R2 of the aperture of the through-hole 52 (W5>R2). The diameter W5 of the aperture of the open part 102 is substantially equal to the width W1 of the wiring connecting part 56. Then, as shown in FIG. 14, according to a wire bonding method, a gold wire used as the conductive core member 58 is connected to the Au layer 64 so as to be positioned substantially at the central axis D of the through-hole 52 (the conductive core member disposing step).

Figure 15:
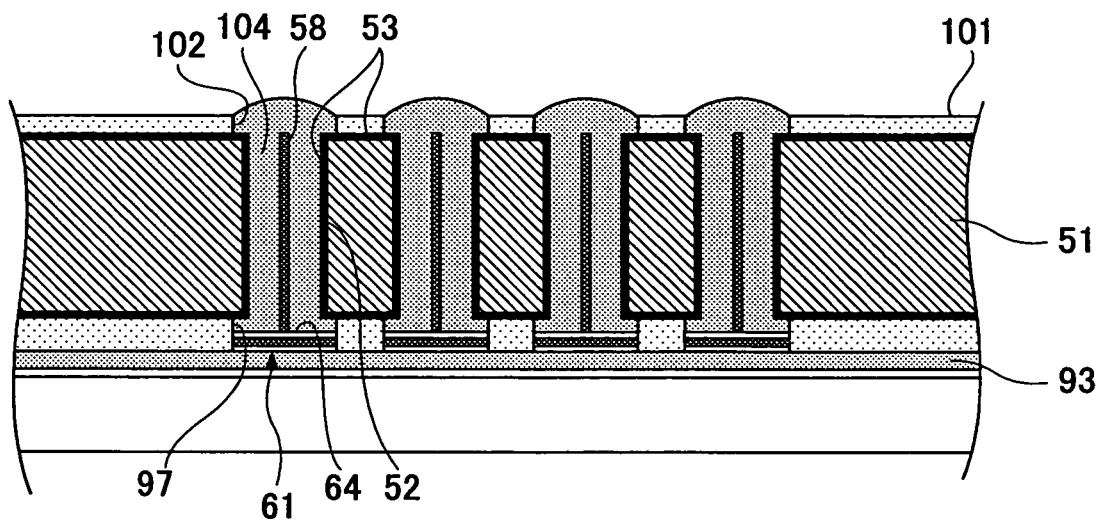
Figure 33:
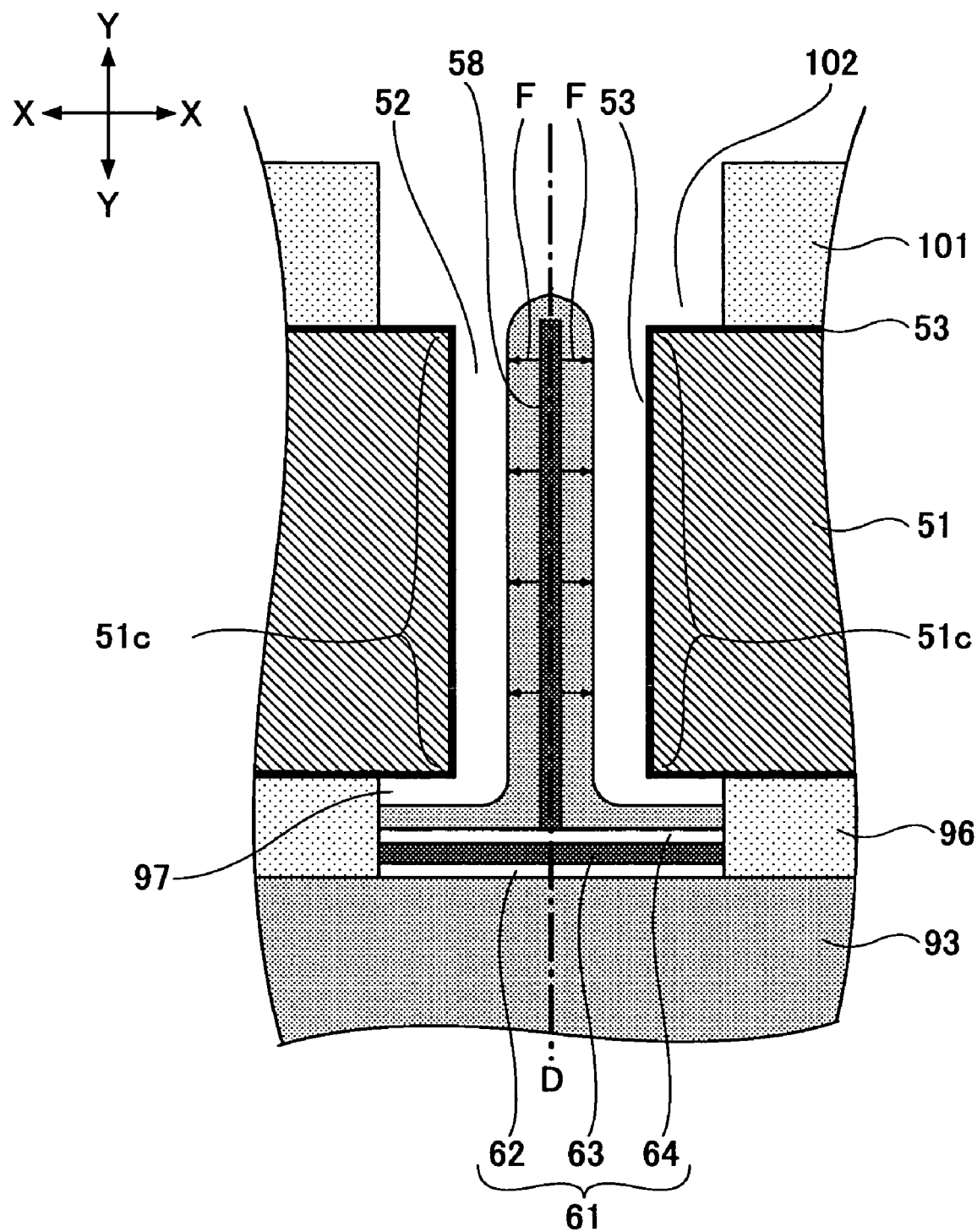
FIG. 33 is a diagram showing a growth process of a conductive metal.

FIG. 33 is a diagram showing a growth process of the conductive metal. It should be noted that the Y←→Y direction is a longitudinal direction of the conductive core member 58, and the X←→X direction is a horizontal direction perpendicular to the Y←→Y direction. F←→F is a direction in which the conductive metal grows (hereinafter, F←→F is referred to as "Direction F"). Next, as shown in FIG. 15, electric current is passed through the metal foil 93, and by using the conductive core member 58 as an electrode, according to the electrolytic plating method, the conductive metal 104 is separated and grown so as to fill the space 97, through-hole 52, and the open part 102 (the conductive metal filling step). In this case, as shown in FIG. 33, in the through-hole 52, the conductive metal grows from the conductive core member 58 to the surface 51c of the base member 51 corresponding to the through-hole 52; thus a void (cavity) is prevented from remaining in the penetrating part 57 (corresponding to the conventional cylindrical penetrating via 15). As the conductive metal 104, for example, a Ni—Co alloy can be used. The composition of the Ni—Co alloy is, for example, Ni:Co=6:4 through 7:3.

Further, as described in the present embodiment, by using the gold wire as an electrode, the Ni—Co alloy is separated and grown so as to fill the space 97, through-hole 52, and the open part 102, and accordingly, the penetrating via 55 is formed. And thus, the penetrating via 55 is formed in a shorter time than the time the penetrating via 55 is formed by filling the space 97, through-hole 52, and the open part 102 with Cu. Accordingly, the productivity of manufacturing the substrate 50 can be improved.

Moreover, the conductive metal 104 can also be formed by the following steps: in the conductive metal filling step, Ni is separated on the surface of the conductive core member 58 by the electrolytic plating method so as to cover the surface of the conductive core member 58 and the surface of the diffusion protecting layer 61, and then, Cu is separated so as to fill the space 97, through-hole 52 and the open part 102.

Figure 16:
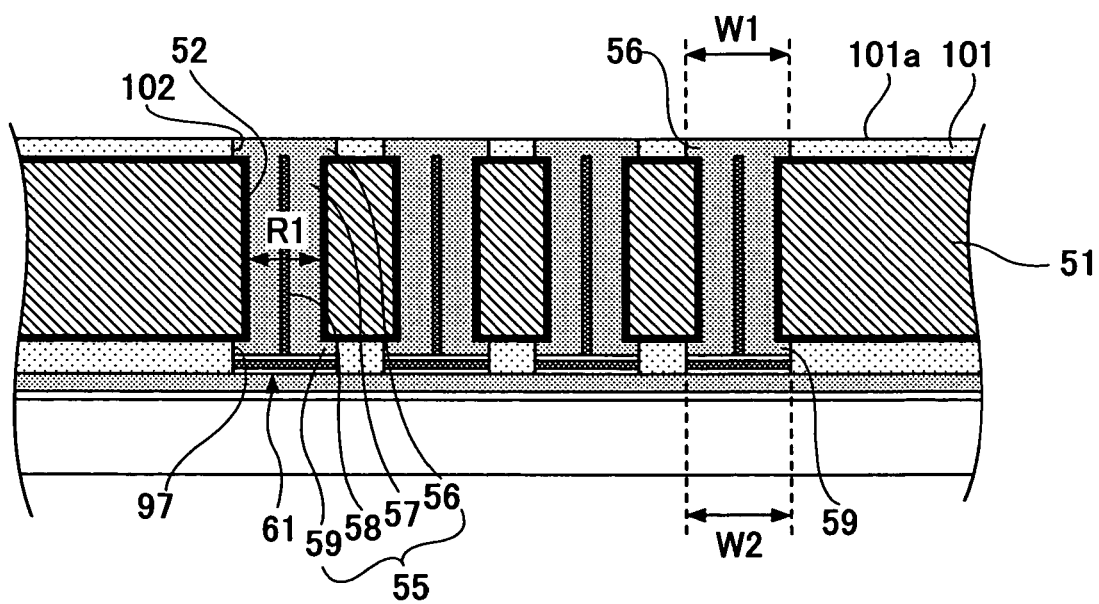

Next, as shown in FIG. 16, the conductive metal 104 protruding from the dry film resist layer 101 is removed by grinding so that the conductive metal 104 and the surface of the dry film resist layer 104 are coplanar. Accordingly, the following components are formed all at once: the connection pad 59 (the first protrusion) having a width W2 in the space 97, the penetrating part 57 having a diameter R1 in the through-hole 52, and the wiring connecting part 56 (the second protrusion) having a width W1 in the open part 102; thus the penetrating via 55 containing the conductive core member 58 therein is formed. It should be noted that the width W1 of the wiring connecting part 56 and the width W2 of the connection pad 59 are greater than the diameter R1 of the penetrating part 57 (W1>R1, W2>R1).

Accordingly, the connection pad 59 and the wiring connecting part 56 which are wider than the diameter R1 of the penetrating part 57, are connected to the penetrating part 57, and thereby, water is prevented from infiltrating a gap between the base member 51 facing the penetrating part 57 and the penetrating part 57; therefore, the penetrating via 55 is prevented from being degraded.

Figure 17:
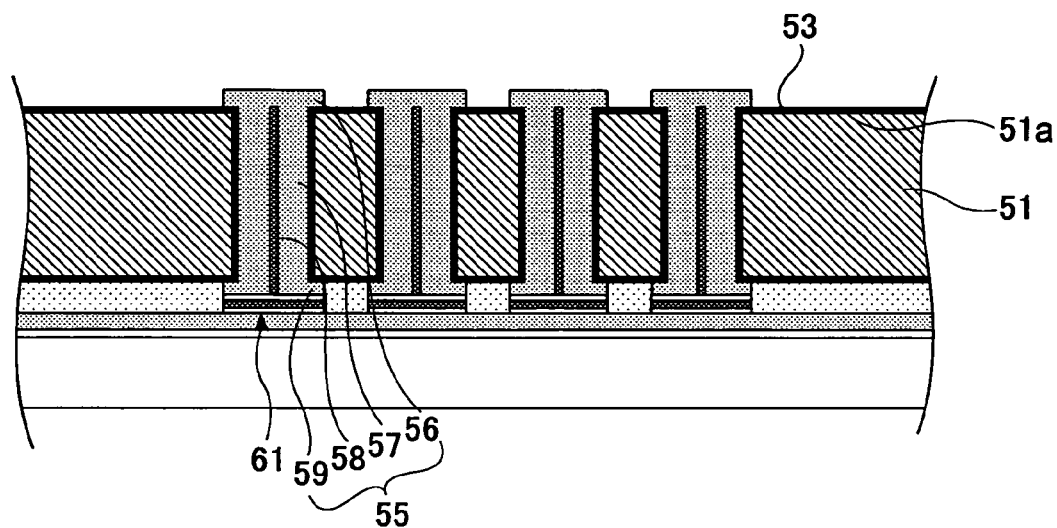
Figure 18:
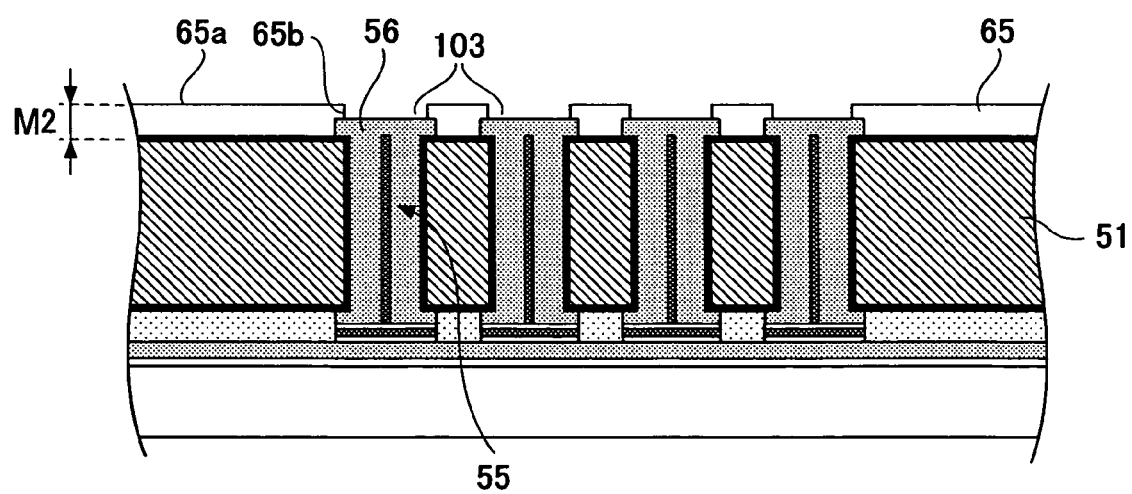

Next, as shown in FIG. 17, the dry film resist layer 101 is removed by the resist stripper. And then, as shown in FIG. 18, an insulating layer 65 having an open part 103 exposing the wiring connecting part 56 is formed on the upper surface 51a of the base member 51. As the insulating layer 65, for example, a resin material containing palladium therein can be used. The thickness M2 of the insulating layer 65 is, for example, 5 μm.

Figure 19:
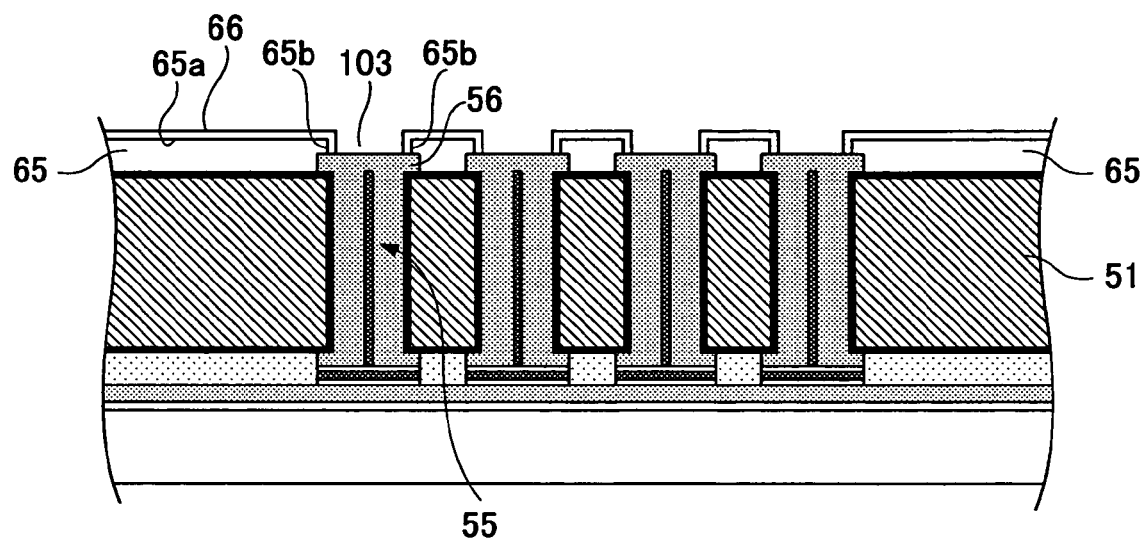

Next, as shown in FIG. 19, according to the electroless plating method, a seed layer 66 is formed on an upper surface 65a of the insulating layer 65 and on lateral sides 65b of the insulating layer 65. As a related matter, when forming a seed layer on a resin layer according to the electroless plating method, conventionally a desmear treatment is performed on the surface of the resin (the insulating layer) in advance so as to roughen the surface, and then a palladium activation treatment is performed on the surface of the resin. The palladium activation treatment is dipping a sample to be plated in one of a catalyzing treatment solution and an accelerating treatment solution, and the palladium to be a core of the electroless plating is separated on the surface of the resin. In the conventional technique, the plated layer cannot be formed by the electroless plating method until the palladium activation treatment is performed. Therefore, in the conventional technology, the manufacturing step is very troublesome. On the contrary, in the present embodiment, an epoxy resin material is applied to the insulating layer 65; thus it is not necessary to perform the desmear treatment and the palladium activation treatment in advance on the insulating layer 65, and accordingly, the seed layer 66 can be formed directly on the insulating layer 65 by the electroless plating method. Thereby, the manufacturing steps of the substrate 50 can be simplified. As the seed layer 66, for example, a Ni layer can be used. Moreover, when the resin containing palladium therein is used as the insulating layer 65 as described in the present embodiment, a Ni—B layer can be formed.

Figure 20:
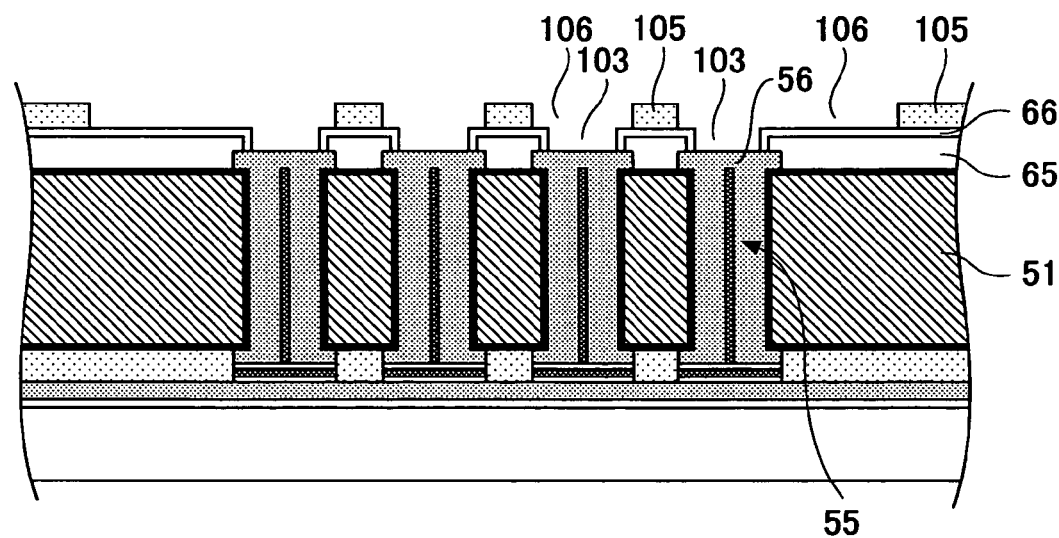
Figure 21:
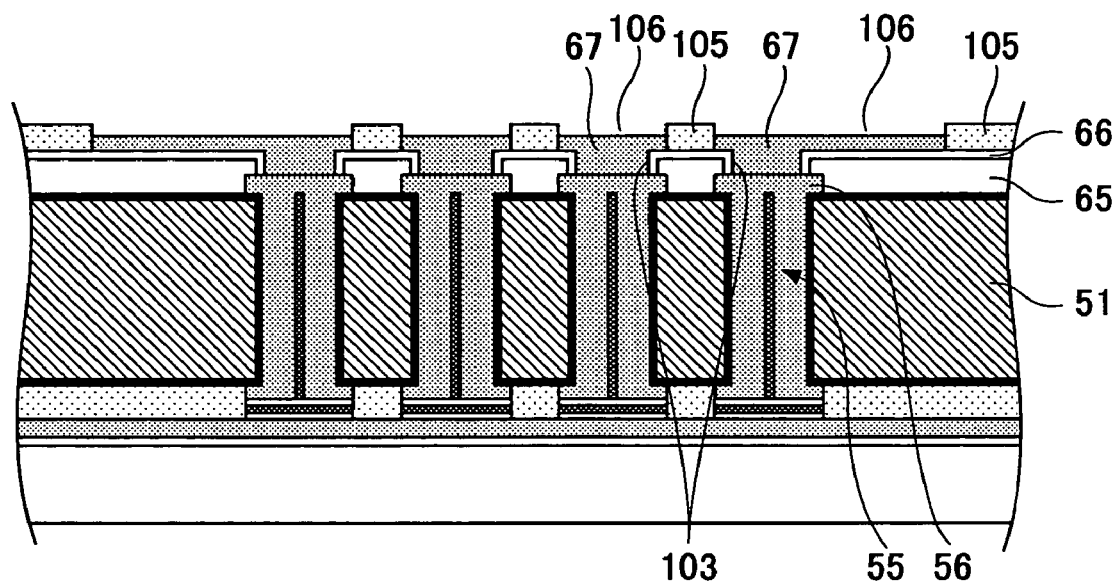

Next, as shown in FIG. 20, a dry film resist layer 105 having an open part 106 is formed on the seed layer 66. The open part 106 corresponds to the area where the wiring 68 is formed. The thickness of the dry film resist layer 105 is, for example, 10 through 15 μm. Then, as shown in FIG. 21, the wiring connecting part 56 and the seed layer 66 are used as an electrode, and according to the electrolytic plating method, the conductive metal part 67 is formed so as to fill the open parts 103 and 106. Accordingly, the conductive metal part 67 and the penetrating via 55 are electrically connected. As for the conductive metal part 67, for example, Cu can be used. The dry film resist layer 105 is removed by the resist stripper after the conductive metal part 67 is formed.

Figure 22:
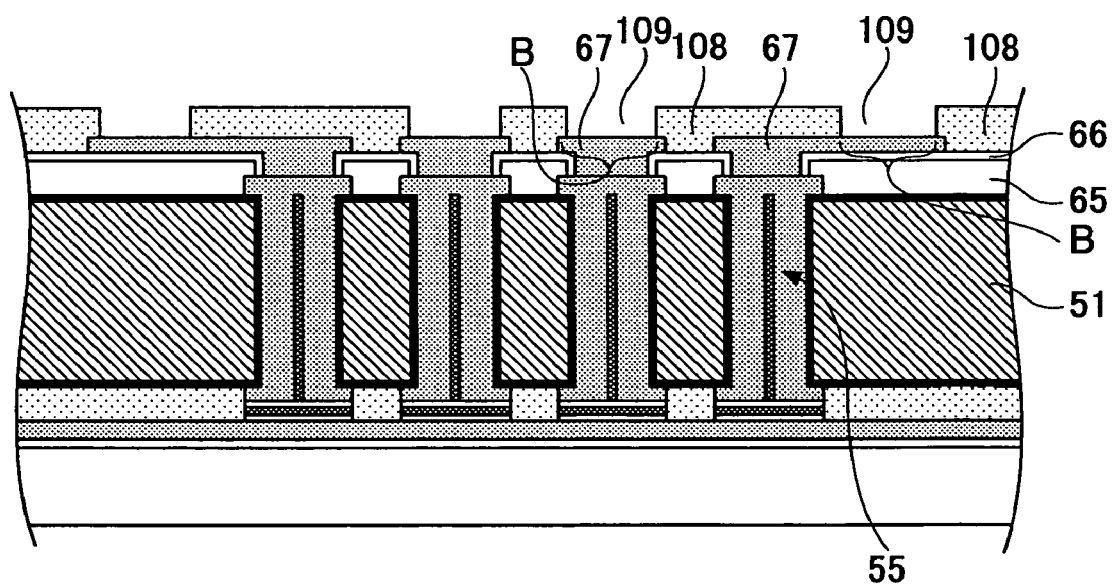

Next, as shown in FIG. 22, a dry film resist layer 108 is formed on the structure shown in FIG. 21 so as to expose the conductive metal part 67 corresponding to the area B where the external connection terminal is formed. The dry film resist layer 108 has an open part 109 exposing the conductive metal part 67 corresponding to the area B.

Figure 23:
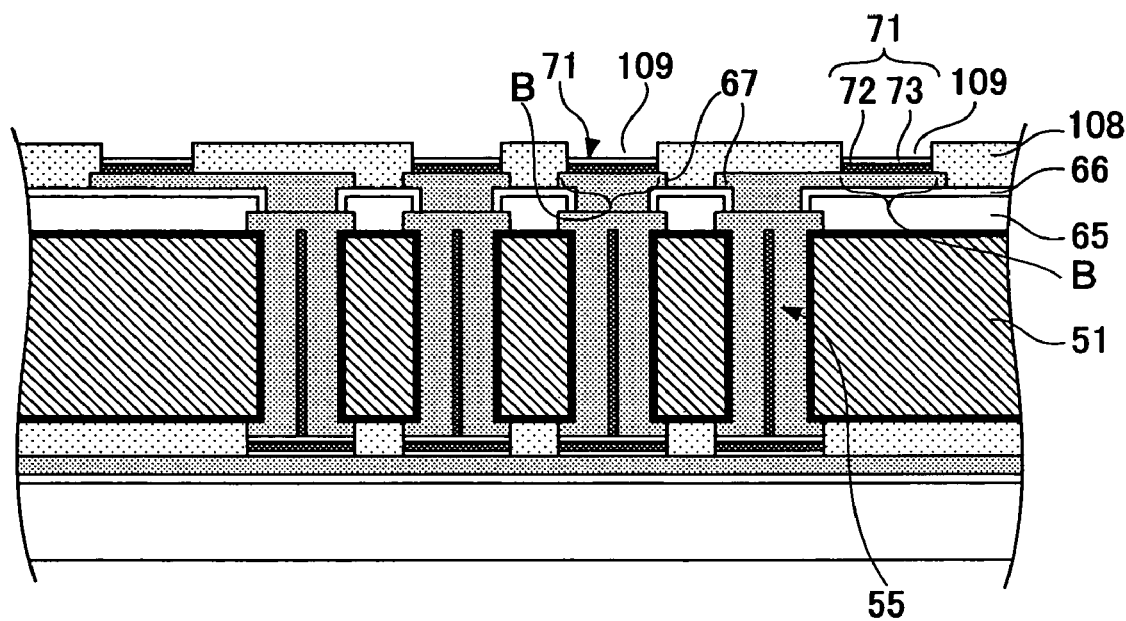

Next, as shown in FIG. 23, by using the conductive metal part 67 as an electrode, according to the electrolytic plating method, a Ni layer 72 and an Au layer 73 are separated and grown in turn on the conductive metal part 67 exposed from the open part 109 so as to form a diffusion protecting layer 71. The thickness of the Ni layer 72 is, for example, 2 through 5 μm, and the thickness of the Au layer 73 is, for example, 0.2 through 0.5 μm. Accordingly, the diffusion protecting layer 71 is formed by the electrolytic plating method; thus the diffusion protecting layer having a layer superior to the layer formed by the electroless plating method can be formed. The dry film resist layer 108 is removed after the second diffusion protecting layer 71 is formed.

Figure 24:
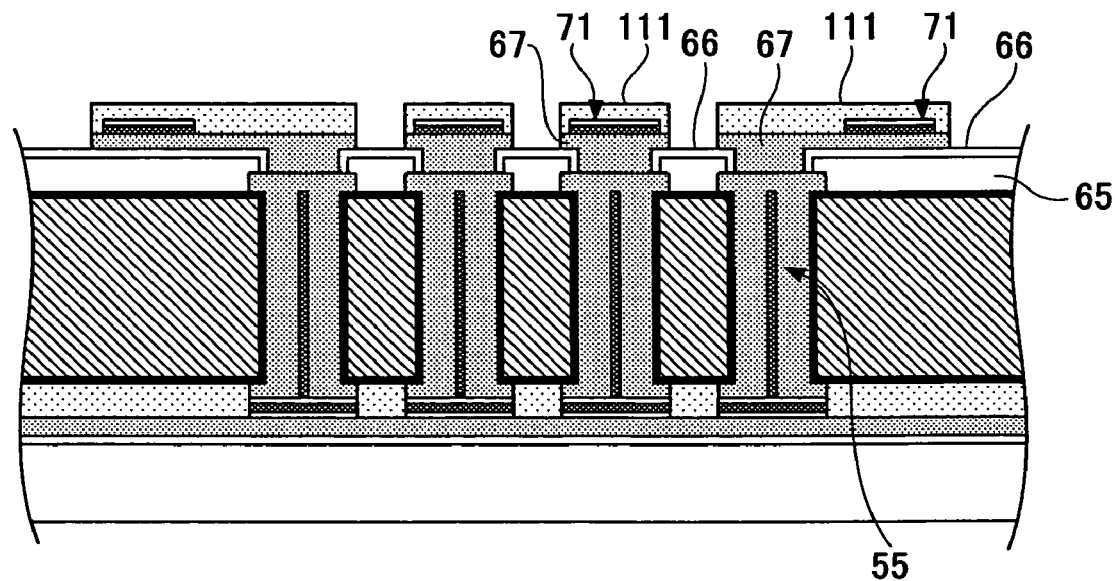
Figure 25:
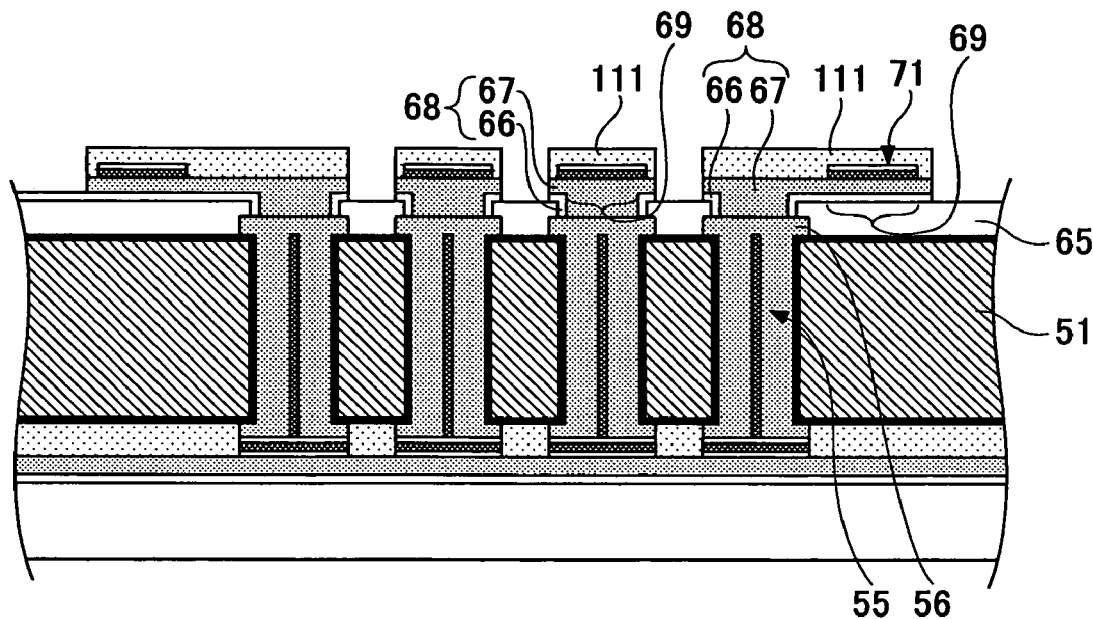
Figure 26:
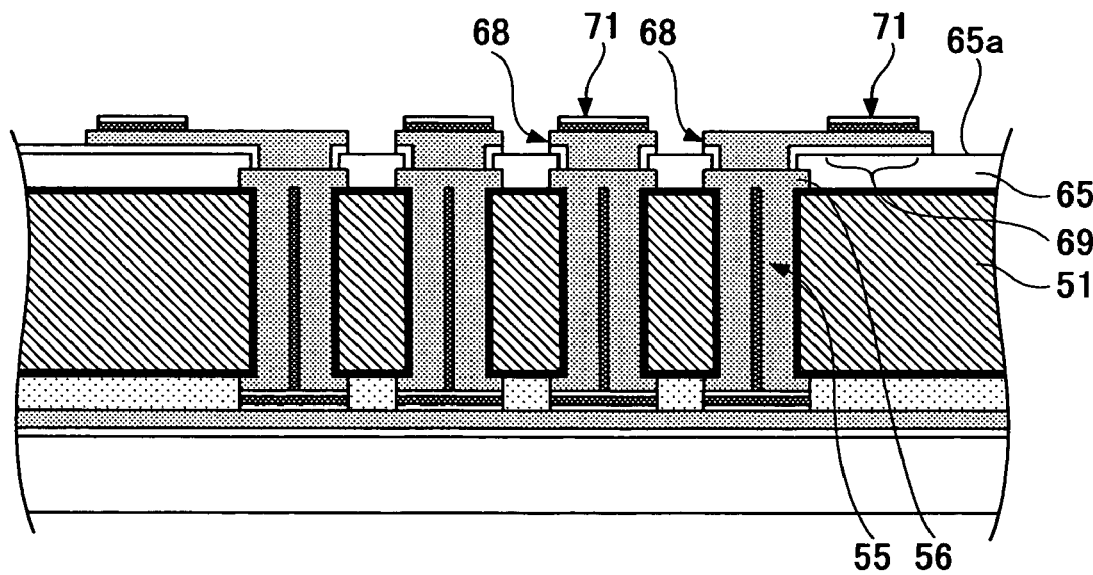

Next, as shown in FIG. 24, a dry film resist layer 111 is formed so as to cover the conductive metal part 67 and the diffusion protecting layer 71. Then, as shown in FIG. 25, the seed layer 66 exposed on the insulating layer 65 is removed by etching. Accordingly, the wiring 68 having the external connection terminal 69, which wiring is composed of the seed layer 66 and the conductive metal part 67, is formed. As shown in FIG. 26, the dry film resist layer 111 is removed by the resist stripper.

Figure 27:
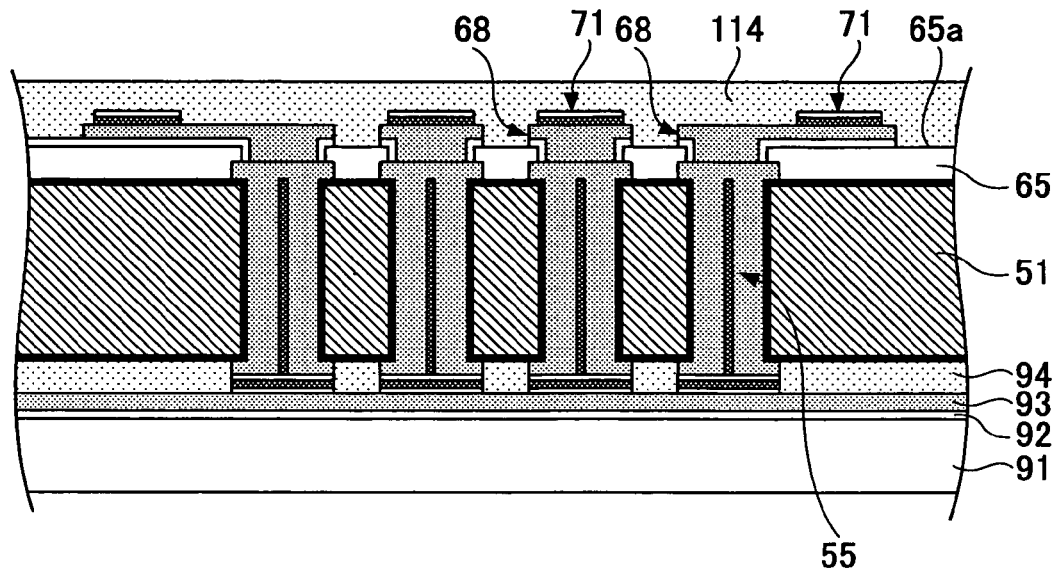

Next, as shown in FIG. 27, a heat-resistant tape 114 is attached so as to cover the upper surface 65a of the insulating layer 65, the wiring 68, and the diffusion protecting layer 71. The heat-resistant tape 114 has tolerance for the etchant. Accordingly, the heat-resistant tape 114 is provided so as to cover the upper surface 65a of the insulating layer 65, wiring 68, and the diffusion protecting layer 71, and thereby, the wiring 68 and the diffusion protecting layer 71 are protected from the thermal treatment (see FIG. 28) performed in removing the support board 91 from the base member 51. Moreover, the wiring 68 is protected from being etched when the metal foil 93 is removed by etching (see FIG. 29). As the heat-resistant tape 114, for example, a PET and a PEN which are flame retardant can be used. It should be noted that the heat-resistant tape 114 is only provided so as to cover at least the wiring 68 and the diffusion protecting layer 71.

Figure 28:
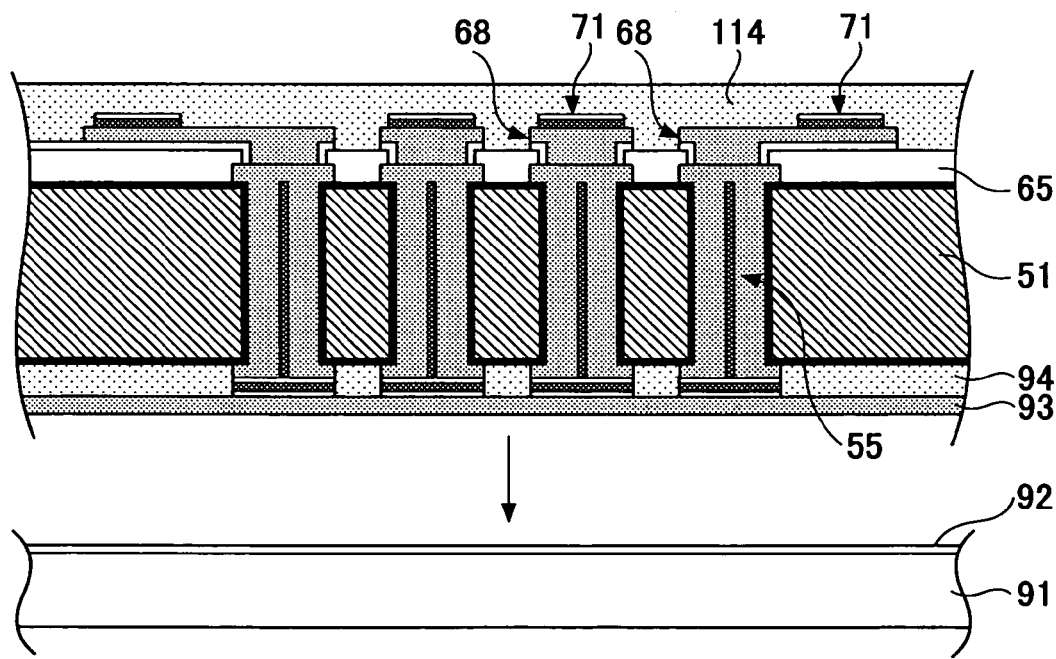
Figure 29:
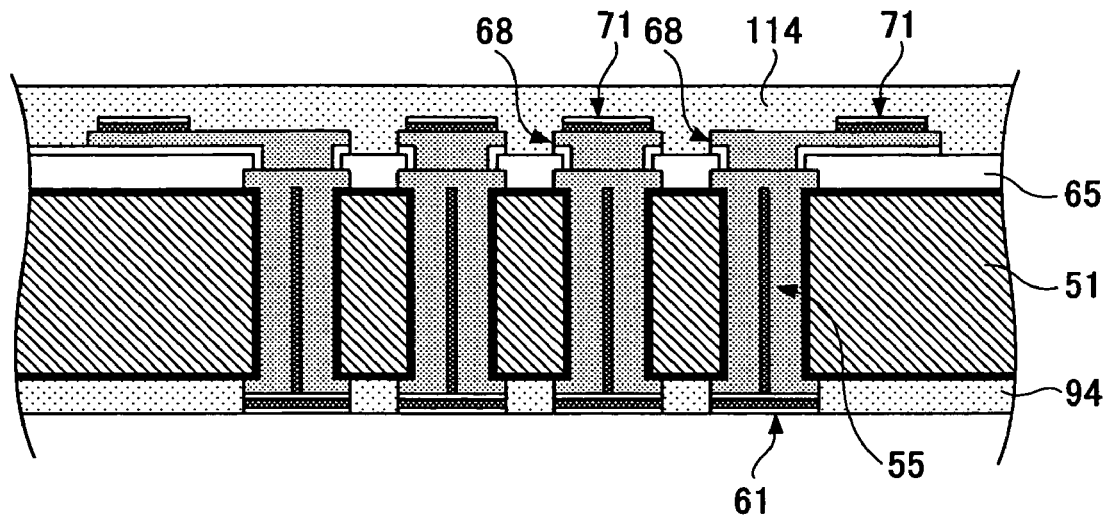

Next, as shown in FIG. 28, the adhesive tape 92 and the support board 91 are removed from the base member 51 by heating (the thermal treatment) the structure shown in FIG. 27. In this case, as the adhesive tape 92, a thermo peal tape is used which loses adhesion when being heated. Moreover, as a condition of the thermal treatment, for example, the heating temperature is 150° C., and the heating time is 30 min. Then, as shown in FIG. 29, the metal foil 93 is removed by etching. Accordingly, the resist layer 94 and the diffusion protecting layer 61 are exposed. Furthermore, as described above, the wiring 68 is covered by the heat-resistant tape 114 having tolerance for the etchant, and thereby, the wiring 68 is not etched when removing the metal foil 93.

Figure 30:
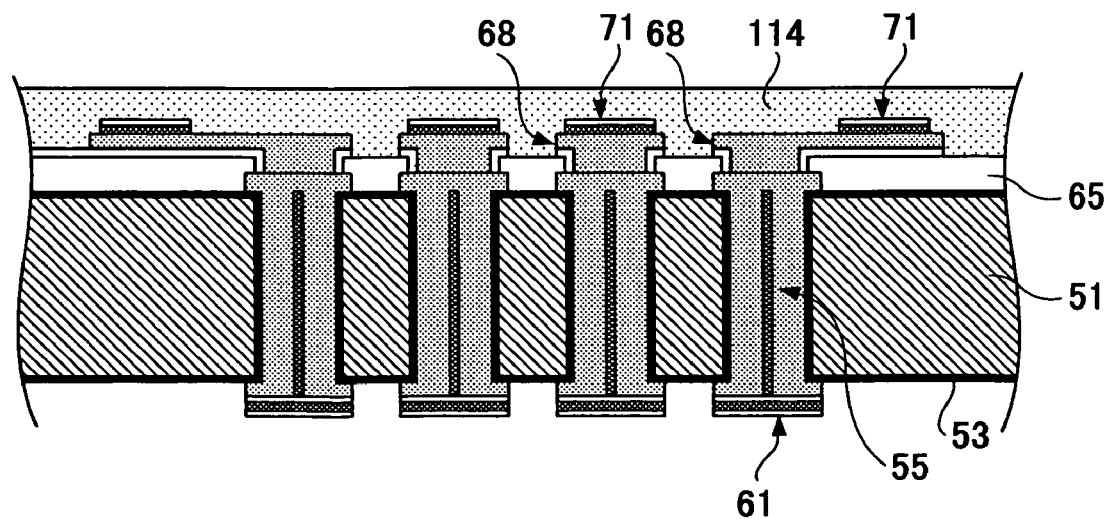
Figure 31:
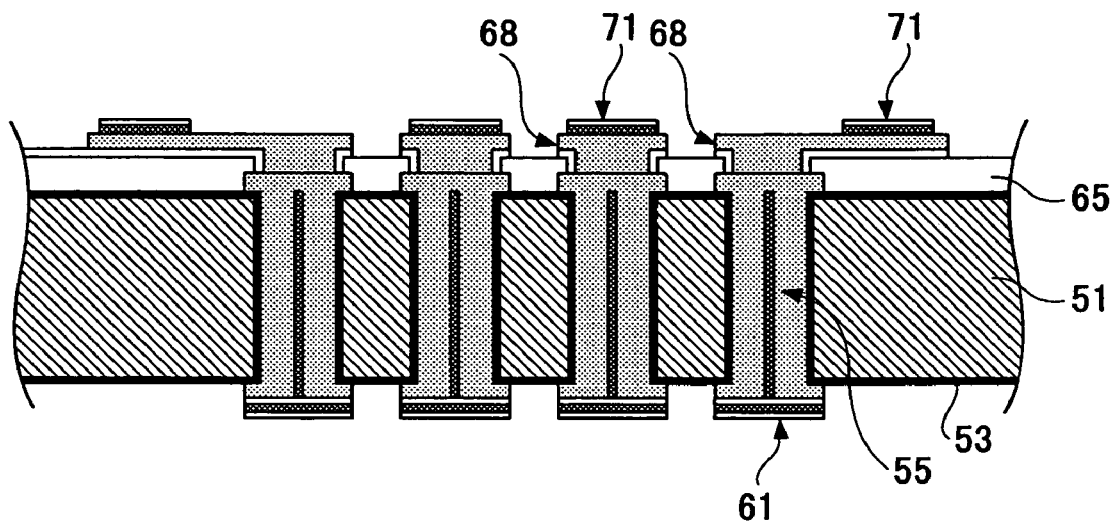
Figure 32:
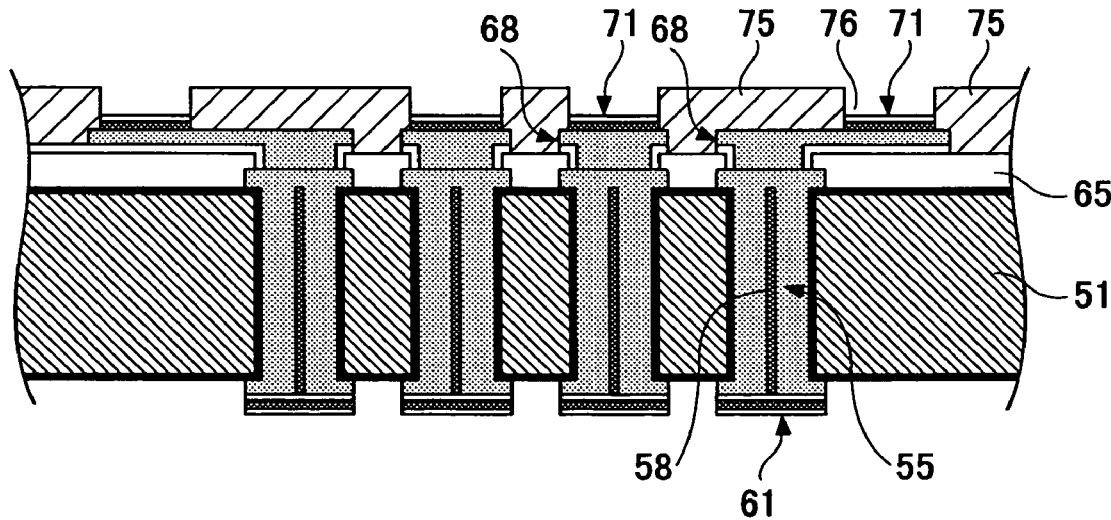

Next, as shown in FIG. 30, the resist layer 94 is removed. Then, as shown in FIG. 31, the heat-resistant tape 114 is removed. After the resist layer 94 and the heat-resistant tape 114 are removed, as shown in FIG. 32, a solder resist layer 75 is formed so as to expose the diffusion protecting layer 71 and to cover the wiring 68 and the insulating layer 65. The solder resist layer 75 has an open part 76 exposing the diffusion protecting layer 71. After the solder resist layer 75 is formed, at scribe lines (the border between the substrate forming areas A as shown in FIG. 4) of the base member 51 is diced into the respective substrates 50 so as to form the substrates 50 as shown in FIG. 2.

As described above, by using the conductive core member 58 as an electrode, the conductive metal 104 is grown from the conductive core member 58 to the surface 51c of the base member 51 having through-hole 52, to be the penetrating via 55. Accordingly, the void is prevented from remaining in the penetrating via 55; thus the electric connection reliability between the wiring 68 and the penetrating via 55 can be improved. Moreover, the wiring connecting part 56 which is wider than the diameter R1 of the penetrating part, is connected to one end of the penetrating part 57, and the connection pad 59 which is wider than the diameter R1 of the penetrating part 57 is connected to the other end of the penetrating part 57, and thereby, water is prevented from infiltrating the gap between the base member 51 facing the penetrating part 57 and the penetrating part 57; thus the penetrating via 55 is protected from being degraded, and accordingly, the electric connection reliability between the wiring 68 and the penetrating via 55 can be improved. Furthermore, the wiring 68 is connected to the wirings connecting part 56 which is wider than the diameter R1 of the penetrating part 57; thus the wiring 68 is easily connected to the wirings connecting part 56.

Second Embodiment

Figure 34:
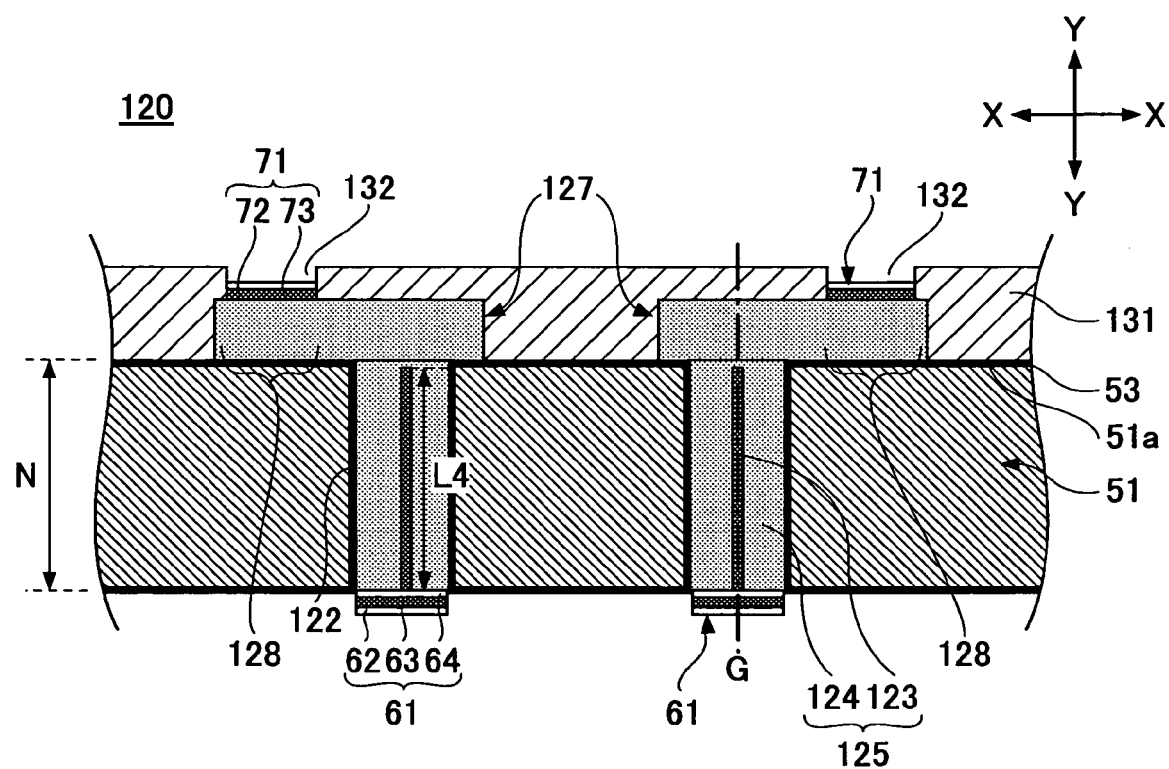
FIG. 34 is a cross-sectional view showing a substrate according to a second embodiment of the present invention.

Next, with reference to FIG. 34, a description is given of a substrate 120 according to the second embodiment of the present invention. FIG. 34 is a cross-sectional view showing the substrate 120 according to the second embodiment of the present invention. It should be noted that "G" as shown in FIG. 34 is a central axis of a through-hole 122 (hereinafter the central axis is referred to as "Central Axis G").

The substrate 120 includes a base member 51, an insulating layer 53, diffusion protecting layers 61 and 71, penetrating vias 125, wirings 127, and a solder resist layer 131.

The base member 51 has plural through-holes 122. Further, on the surface of the base member 51 including the through-holes 122, the insulating layer 53 is formed. The penetrating via 125 disposed in the through-hole 122 is composed of a conductive metal part 124 and a conductive core member 123. The shape of the penetrating via 125 is to be cylindrical. The conductive core member 123 is disposed in a position substantially coinciding with Central Axis G of the through-hole 122 by the diffusion protecting layer 61. The length L4 of the conductive core member 123 is to be substantially equal to the depth N of the through-hole 122.

Accordingly, the length L4 of the conductive core member is set substantially equal to the depth N of the thorough-hole 122; and by using the conductive core member 123 as an electrode, the conductive metal part 124 is grown from the conductive core member 123 to the surface of the base member 51 having the through-holes 122 so as to fill the through-hole 122, and thereby, a void is prevented from remaining in the penetrating via 125. Accordingly, the electric connection reliability between the wiring 127 and the penetrating via 125 can be improved.

As the conductive core member, for example, a gold wire formed by the wire bonding method can be used. When the gold wire is used as the conductive core member 123, the thickness of the gold wire can be, for example, 20 through 30 μm (preferably, 25 μm).

The conductive metal part 124 is provided so as to fill the thorough-hole 122 where the conductive core member 123 is disposed. As for the conductive metal part 124, for example, a Ni—Co alloy can be used. The composition of the Ni—Co alloy is, for example, Ni:Co=6:4 through 7:3.

The diffusion protecting layer 61 is provided on the lower end of the penetrating via 125. The diffusion protecting layer 61 is composed of an Au layer 62, a Ni layer 63, and an Au layer 64. The conductive metal part 124 and the conductive core member 123 are connected to the Au layer 64.

The wiring 127 is provided on the surface 51a of the base member 51 where the insulating layer 53 is formed. The wiring 127 having an external connection terminal 128 is connected to the upper end of the penetrating via 125. The diffusion protecting layer 71 is formed on the external connection terminal 128. The diffusion protecting layer 71 is composed of a Ni layer 72 and an Au layer 73. The solder resist layer 131 is formed so as to expose the diffusion protecting layer 71 and to cover the upper surface 51a of the base member 51 on which the insulating layer 53 is formed and the wiring 127. The solder resist layer 131 has an open part 132 exposing the external connection terminal 128.

As described above, in the case where the conductive core member 123 is disposed in the cylindrical penetrating via 125, the conductive metal is separated and the conductive metal part 124 is grown from the conductive core member 123 to the surface of the base member 51 including the through-hole 122; thus a void is prevented from remaining in the penetrating via 125, and accordingly, the electric connection reliability between the wiring 127 and the penetrating via 125 can be improved.

Further, the present invention is not limited to these embodiments, but variations and modifications may be made without departing from the scope of the present invention.

The present invention can be applied to a substrate wherein a void is prevented from remaining in the penetrating via, and thereby, the penetrating via is protected from being degraded, and thus, the electric connection reliability of the penetrating via connected to the wiring can be improved; and can be applied to the method for manufacturing the same.

According to at least one of the embodiments of the present invention, the conductive core member is supported by the diffusion protecting layer so as to set the conductive core member substantially at a central axis of the through-hole.

Further, the length of the conductive core member is substantially equal to the depth of the through-hole, and the through-hole is filled with the conductive metal so as to prevent a void (cavity) from remaining in the penetrating via.

The substrate as above described, includes wiring having an external connection terminal connected to an end of the penetrating via.

The wiring is connected to the penetrating via wherein the void is prevented from remaining inside the penetrating via, so that the electric connection reliability between the wiring and the penetrating via can be improved.

Further, the length of the conductive core member is shorter than the length of the penetrating via; thus the wiring is easily connected to the penetrating via without being obstructed by the conductive core member.

Moreover, a conductive member is provided for supporting the conductive core member so as to set the conductive core member substantially at a central axis of the through-hole.

Furthermore, the diffusion protecting layer is used as the conductive member, so that a semiconductor device and another substrate can be connected to the penetrating via through the diffusion protecting layer.

According to another aspect of the embodiment of the present invention, the second protrusion is connected to wiring having an external connection terminal.

According to the above described aspect of the embodiment, the wiring is connected to the penetrating via wherein the void is prevented from remaining inside the penetrating via, and the electric connection reliability between the wiring and the penetrating via can be improved.

The present application is based on Japanese Priority Application No.2004-323940 filed on Nov. 8, 2004, with the Japanese Patent Office, the entire contents of which are hereby incorporated by reference.

What is claimed is:

1. A substrate comprising:

a base member having a through-hole; and a conductive metal filling said through-hole so as to form a penetrating via; wherein said penetrating via containing a conductive core member, which is disposed substantially at a central axis of said through-hole, said conductive core member being operable to conduct electrical energy to deposit and grow said conductive metal by an electrolytic plating process, said conductive core extending up to a top edge of said through-hole, wherein said conductive core member is covered with said conductive metal, said conductive metal forming a unitary top end portion, unitary to a main part of said penetrating via inside said through-hole at a top end of said penetrating via and a unitary bottom end portion, unitary to said main part at a bottom end of said penetrating via, said unitary top end portion covering a top surface of a said base member around said top edge of said through-hole, said unitary bottom end portion covering a bottom surface of said base member around a bottom edge of said through-hole, said conductive core member extending from a bottom conductor covering said unitary bottom end portion toward said unitary top end portion, and wherein said unitary top end portion covers a top end of said conductive core member.

2. The substrate as claimed in claim 1, wherein said bottom conductor forms a diffusion protecting layer.

3. The substrate as claimed in claim 1, wherein a length of said conductive core member is substantially equal to a depth of said through-hole.

4. The substrate as claimed in claim 1, further comprising a wiring having an external connection terminal connected to said unitary top end portion of said penetrating via.

5. The substrate as claimed in claim 1, wherein said unitary top end portion forms a protrusion at said top surface of said substrate and said unitary bottom end portion forms a protrusion at said bottom surface of said substrate.

6. A method for manufacturing a substrate comprising a base member having a through-hole; and a conductive metal filling said through-hole so as to form a penetrating via;

wherein said penetrating via containing a conductive core member, which is disposed substantially at a central axis of said through-hole, said conductive core member being operable to conduct electrical energy to deposit and grow said conductive metal by an electrolytic plating process, said conductive core extending up to a top edge of said through-hole, wherein said conductive core member is covered with said conductive metal, said conductive metal forming a unitary top end portion unitary to a main part of said penetrating via inside said through-hole at a top end of said penetrating via and a unitary bottom end portion unitary to said main part at a bottom end of said penetrating via, said unitary top end portion covering a top surface of said base member around said top edge of said through-hole, said unitary bottom end portion covering a bottom surface of said base member around a bottom edge of said through-hole, said conductive core member extending from a bottom conductor covering said unitary bottom end portion toward said unitary top end portion, and wherein said unitary top end portion covers a top end of said conductive core member, said method comprising the steps of:

disposing said conductive core member substantially at a central axis of said through-hole; and filling said through-hole with said conductive metal according to an electrolytic plating method by using said conductive core member as an electrode.

* * * * *